(12) United States Patent
Nakanishi et al.

(10) Patent No.: US 8,448,017 B2
(45) Date of Patent: May 21, 2013

(54) MEMORY APPARATUS, MEMORY CONTROLLING METHOD AND PROGRAM

(75) Inventors: Kenichi Nakanishi, Tokyo (JP); Keiichi Tsutsui, Tokyo (JP); Junichi Koshiyama, Tokyo (JP)

(73) Assignee: Sony Corporation, Tokyo (JP)

( * ) Notice: Subject to any disclaimer, the term of this patent is extended or adjusted under 35 U.S.C. 154(b) by 404 days.

(21) Appl. No.: 12/801,736

(22) Filed: Jun. 23, 2010

(65) Prior Publication Data

US 2011/0010580 A1 Jan. 13, 2011

(30) Foreign Application Priority Data

Jul. 7, 2009 (JP) ................................. 2009-160458

(51) Int. Cl.
*G06F 11/00* (2006.01)

(52) U.S. Cl.
USPC .......... 714/6.13; 711/103; 714/6.1; 714/6.11; 714/42

(58) Field of Classification Search
USPC ................ 714/6.1, 6.11, 6.13, 42; 711/103, 711/118
See application file for complete search history.

(56) References Cited

U.S. PATENT DOCUMENTS

| | | | | |
|---|---|---|---|---|
| 5,761,717 A * | 6/1998 | Vishlitzky et al. | ............ | 711/136 |
| 6,523,132 B1 * | 2/2003 | Harari et al. | ................ | 714/6.13 |
| 2004/0057316 A1 * | 3/2004 | Kozakai et al. | ............... | 365/222 |
| 2005/0144365 A1 * | 6/2005 | Gorobets et al. | .............. | 711/103 |
| 2005/0289389 A1 * | 12/2005 | Yamagami et al. | ........... | 711/103 |

FOREIGN PATENT DOCUMENTS

| | | |
|---|---|---|
| JP | 05-150913 A | 6/1993 |
| JP | 05-204561 A | 8/1993 |
| JP | 06-332806 A | 12/1994 |
| JP | 07-093215 A | 4/1995 |
| JP | 08-007597 A | 1/1996 |
| JP | 08-031190 A | 2/1996 |
| JP | 09-128962 A | 5/1997 |
| JP | 2003-085034 A | 3/2003 |
| JP | 2003-234000 A | 8/2003 |
| JP | 2004-310930 A | 11/2004 |
| JP | 2006-294143 A | 10/2006 |
| JP | 2007-072810 A | 3/2007 |
| WO | WO-2006-104036 A1 | 10/2006 |
| WO | WO-2006-129345 A1 | 12/2006 |

OTHER PUBLICATIONS

Japanese Office Action issued Mar. 5, 2013 for corresponding Japanese Application No. 2009-160458.

* cited by examiner

*Primary Examiner* — Joseph D Manoskey
(74) *Attorney, Agent, or Firm* — Rader, Fishman & Grauer PLLC

(57) ABSTRACT

A memory apparatus includes a memory having a main memory area and a replacement area, and a memory controller having a function of issuing instructions corresponding to commands to carry out transmission and reception of data and reading of status information of the memory.

18 Claims, 27 Drawing Sheets

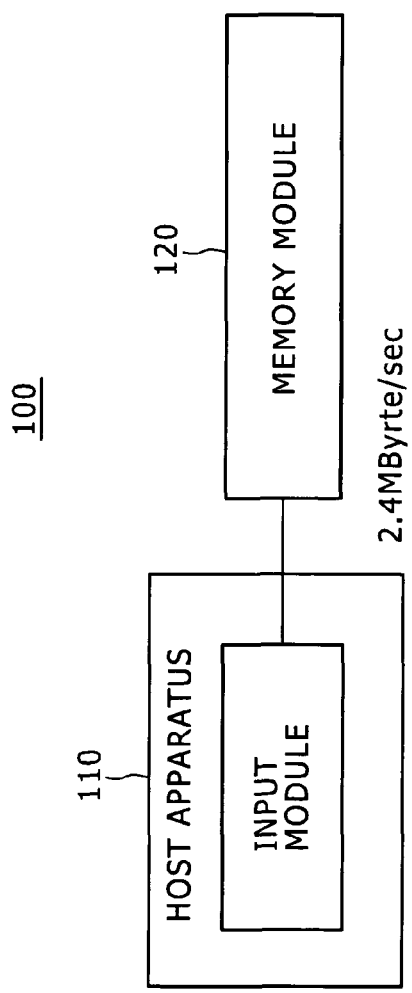
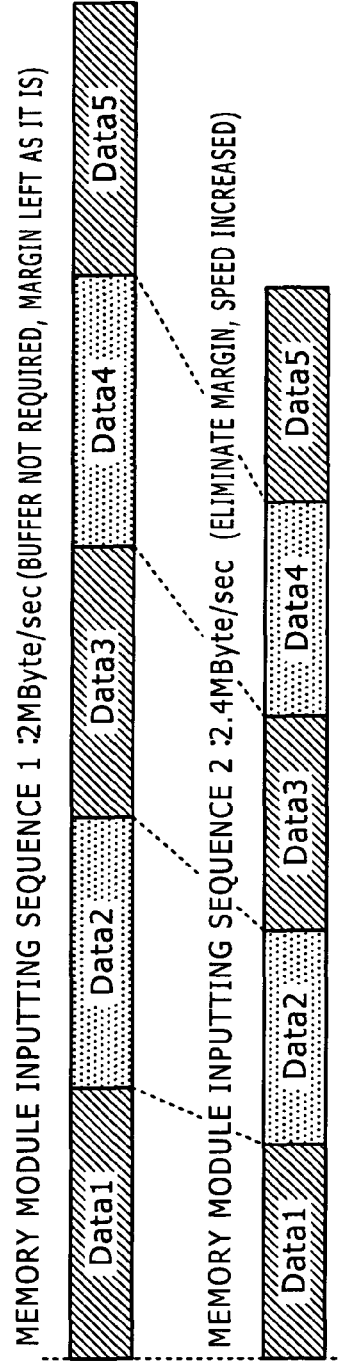
FIG. 6A
FIG. 6B

EXAMPLE : Flag=0(UNUSED)/Flag=1(USED)

MEMORY APPARATUS, MEMORY CONTROLLING METHOD AND PROGRAM

BACKGROUND OF THE INVENTION

1. Field of the Invention

This invention relates to a memory apparatus, a memory controlling method and a program having a replacement processing function for replacing a memory cell which suffers from an error with another memory cell in a replacement area.

2. Description of the Related Art

Verify reading after writing or erasure of data into or from memory cells of a volatile or nonvolatile memory which allows electric writing or erasure is carried out to carry out a series of controlling processes of verifying whether or not writing or erasure has been carried out correctly.

FIG. 1 illustrates a processing flow of a writing process into memory cells.

Referring to FIG. 1, the memory apparatus first carries out writing into a memory cell at step ST1 and then carries out verification at step ST2, whereafter it carries out a comparison process between the read out data and the write data at step ST3.

If the data coincide with each other as a result of the comparison process, then the processing is ended, but if the data do not coincide with each other, then the processing steps beginning with step ST1 are repeated by a designated number of times until it is detected at step ST4 that the data coincide with each other.

Similar processing is carried out also in the case of erasure.

In this manner, the memory apparatus repeats the series of controlling operations by a predetermined number of times until writing or erasure is carried out correctly. If coincide of data is not detected with a memory cell even if the series of controlling operations is repeated by more than the predetermined number of times, then it is decided that the memory cell is a defective memory cell whose characteristic has changed or deteriorated.

As a result, a notification of an error of the writing or erasure process is sent to a controller.

Incidentally, it is popular with regard to volatile memories and nonvolatile memories to carry out a replacement process for an initial defective memory cell which is found in an inspection.

A technique for a nonvolatile memory ready for a replacement process for a defective memory cell which is found also upon writing is proposed, for example, in Japanese Patent Application No. 2007-518819 and Japanese Patent Laid-Open Nos. Hei 9-128962, Hei 8-031190 and Hei 8-007597.

FIG. 2 illustrates a flow of operations of a replacement process proposed already.

Replacement processes used in the techniques disclosed in the documents mentioned above commonly include such steps as seen in FIG. 2.

It is to be noted that, in the following description, a defective memory cell is sometimes referred to as defective cell and an alternate memory cell is sometimes referred to as replacement cell.

Referring to FIG. 2, at first step ST11, a replacement cell which can be used alternately and is not used as yet in a replacement area is determined from the address of a defective cell.

Then at second step ST12, data which should originally be written into the defective cell is written into the replacement cell and it is confirmed that the writing is completed normally.

Then at third step ST13, it is confirmed whether or not an error has occurred.

If an error has occurred, then it is determined at fourth step ST14 that also the replacement cell is a defective cell and should be inhibited from being used, and the replacement process is ended as an error and, when a replacement process is started again, this is retried with another replacement cell.

On the other hand, if no error has occurred and the writing is completed normally, then it is stored at fifth step ST15 that accessing to the defective cell upon address decoding should be changed over to accessing to the replacement cell, and the replacement process is completed therewith.

SUMMARY OF THE INVENTION

Since the proposed replacement process requires such a series of processing operations as described above, it requires a longer period of time than an ordinary writing process.

Further, since writing into and erasure from the replacement cell itself are involved in the replacement process as described above, also there is the possibility that an error may occur.

In a memory system which is expected to continue execution of a write command at a writing speed higher than a certain fixed speed, if the memory described above is used, then the write command cannot be completed before a replacement process is carried out and completed.

The replacement process is a process which is carried out exceptionally and is not always caused. However, if a margin corresponding to a period of time necessary for the replacement process is not provided, then writing into the memory cannot be carried out in time, resulting in failure of the system.

Thus, a margin corresponding to a period of time required for a replacement process is assured by such a method of additionally providing a buffer having a size equal to that of data to be written as seen in FIGS. 3A and 3B.

FIGS. 3A and 3B illustrate an example of an existing buffer configuration and a data transfer sequence.

Referring first to FIG. 3A, a memory system 1 shown includes a host apparatus 2 and a memory module 3.

The host apparatus 2 typically includes an input module 21 and a buffer section 22. The buffer section 22 includes two buffers 22A and 22B connected in parallel between the input module 21 and the memory module 3.

In the example, the writing speed in a buffer inputting sequence is 2 Mbyte/sec and the writing speed in a memory module inputting sequence is 2.4 Mbyte/sec.

However, increase of the buffer size makes a factor of increase of the cost of the memory system or makes a factor of reduction of the writing speed which can be implemented in the memory system.

Referring now to FIG. 3B, when a replacement process becomes required, if an increasing period of time required for the replacement process in data transfer is within a margin MGN, then this does not matter. However, if the increasing period of time required for the replacement process exceeds the margin MGN, then an overflow occurs disadvantageously.

In order to solve such a situation as just described, it is significant to reduce the time required for the replacement process.

Therefore, it is desirable to provide a memory apparatus, a memory controlling method and a program which can reduce the time required for a replacement process when a writing error is caused by a variation of a writing characteristic of a memory cell.

According to an embodiment of the present invention, there is provided a memory apparatus including a memory having a main memory area and a replacement area, and a memory controller having a function of issuing instructions corresponding to commands to carry out transmission and reception of data and reading of status information of the memory. The memory includes a function of issuing, when busy time required for writing does not come to an end within a fixed period of time, an error notification that the memory cell is defective to the memory controller, a replacement processing function of changing over a memory cell in the main memory area with which an error has occurred with a memory cell in the replacement area and of storing an address of a defective memory cell and automatically changing over accessing to the defective memory cell upon address decoding to accessing to the replacement memory cell, and a save area having a plurality of regions each for saving a address of a defective memory cell and data in pair. The save area includes, in each of the regions in each of which an address of a defective memory cell and data are saved in pair, a flag indicative of whether the region is in a used state or in an unused state. The memory further includes a function of retaining, when a defective memory cell newly appears, an address of the new defective memory cell and data into one of unused regions of the save area and setting the flag to the used state, and a function of setting, when the replacement process is carried out and the information in the save area becomes unnecessary, the flag to the unused state.

According to another embodiment of the present invention, there is provided a memory controlling method including the steps of: issuing, when busy time required for writing does not come to an end within a fixed period of time, an error notification that the memory cell is defective to a memory controller; and carrying out a replacement process of changing over a memory cell in a main memory area with which an error has occurred with a memory cell in a replacement area and storing an address of a defective memory cell and then automatically changing over accessing to the defective memory cell upon address decoding to accessing to the replacement memory cell. The method further includes the steps of: retaining, when a defective memory cell newly appears, an address of the new defective memory cell and data into one of unused regions of a save area, which has a plurality of regions each for saving an address of a defective memory cell and data in pair and includes a flag indicative of whether the region is in a used state or in an unused state and setting the flag to the used state; and setting, when the replacement process is carried out and the information in the save area becomes unnecessary, the flag to the unused state.

According to a further embodiment of the present invention, there is provided a program for causing a computer to execute a memory controlling process including the steps of: issuing, when busy time required for writing does not come to an end within a fixed period of time, an error notification that the memory cell is defective to a memory controller; and carrying out a replacement process of changing over a memory cell in a main memory area with which an error has occurred with a memory cell in a replacement area and storing an address of a defective memory cell and then automatically changing over accessing to the defective memory cell upon address decoding to accessing to the replacement memory cell. The memory controlling process further includes the steps of: retaining, when a defective memory cell newly appears, an address of the new defective memory cell and data into one of unused regions of a save area, which has a plurality of regions each for saving an address of a defective memory cell and data in pair and includes a flag indicative of whether the region is in a used state or in an unused state and setting the flag to the used state, and setting, when the replacement process is carried out and the information in the save area becomes unnecessary, the flag to the unused state.

With the memory apparatus, memory controlling method and program, where they are applied to a memory system which is executed to continue writing at a writing speed higher than a certain fixed speed, the time required for a replacement process when a writing error is caused by a variation of a writing characteristic of a cell can be reduced.

The above and other objects, features and advantages of the present invention will become apparent from the following description and the appended claims, taken in conjunction with the accompanying drawings in which like parts or elements denoted by like reference symbols.

BRIEF DESCRIPTION OF THE DRAWINGS

FIGS. 6A and 6B are a block diagram and a diagrammatic view, respectively, illustrating an execution process of a write command executed at a writing speed higher than a fixed speed in the memory system of FIG. 4;

DETAILED DESCRIPTION OF THE PREFERRED EMBODIMENTS

In the following, preferred embodiments of the present invention are described with reference to the accompanying drawings.

It is to be noted that the description is given in the following order.
1. First Embodiment
2. Second Embodiment
3. Third Embodiment <1. First Embodiment>

Figure 4:
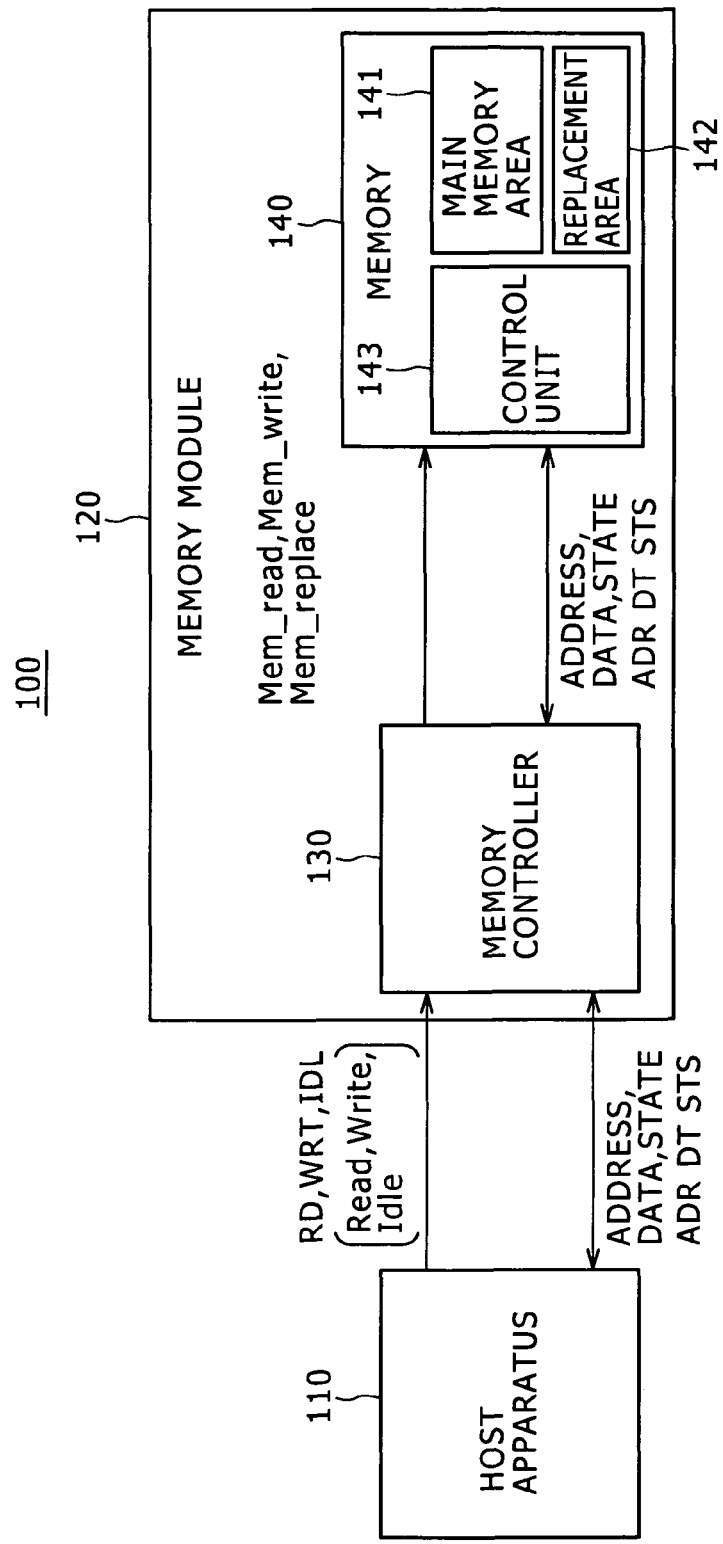
FIG. 4 is a block diagram showing an example of a configuration of a memory system to which a memory apparatus according to a first embodiment of the present invention is applied.

FIG. 4 shows an example of a configuration of a memory system to which a memory apparatus according to a first embodiment of the present invention is applied.

Referring to FIG. 4, a memory system 100 shown includes a host apparatus 110 and a memory module 120.

The memory module 120 includes a memory controller 130 and a memory 140.

The memory 140 is formed of a nonvolatile memory, for example.

It is to be noted that, while the memory controller 130 and the memory 140 form the memory apparatus, they may be integrated in the same chip or may be integrated otherwise in separate chips.

The host apparatus 110 controls the memory module 120 to execute an object application.

The host apparatus 110 issues a read command RD and a write command WRT to the memory module 120 to carry out transmission and reception of data DT and confirmation of a processing result of the commands.

The host apparatus 110 issues an idle command IDL to the memory module 120. This idle command IDL places the memory module 120 into a standby state, and restoration of an ordinary state from the standby state is carried out upon reception of a next command.

The memory controller 130 is interposed between the host apparatus 110 and the memory 140 and carries out the following process as an interfacing conversion process between them.

In particular, the memory controller 130 converts a reading process (Mem_read), a writing process (Mem_write), a replacement process (Mem_replace) and so forth into memory commands and issues the memory commands to carry out transmission and reception of data DT, reading of status information STS of the memory 140 and so forth.

The memory controller 130 issues an instruction for a replacement process in the standby state.

Figure 5:
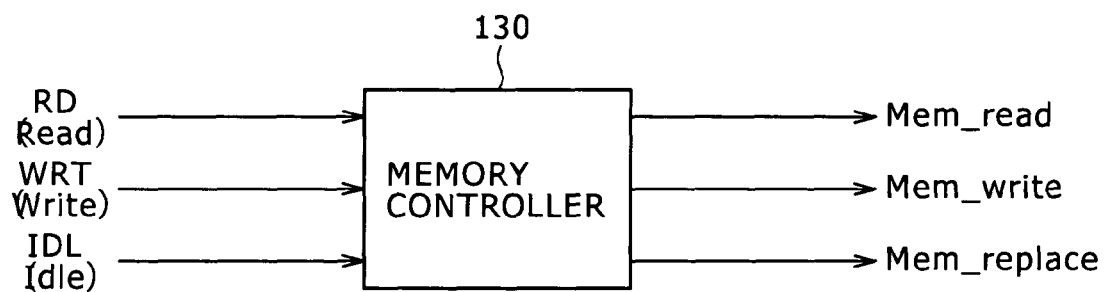
FIG. 5 is a diagrammatic view illustrating an example of correspondence between commands transmitted from a host apparatus to a memory module or memory controller shown in FIG. 4 and commands transmitted from the memory controller to a memory.

FIG. 5 illustrates an example of correspondence between commands to be transmitted from the host apparatus 110 to the memory controller 130 of the memory module 120 and commands to be transmitted from the memory controller 130 to the memory 140.

Referring to FIG. 5, the memory controller 130 converts the read command RD from the host apparatus 110 into a read processing command Mem_read (which may be hereinafter referred to also as Mem_read command) and supplies the read processing command Mem_read to the memory 140.

The memory controller 130 converts the write command WRT from the host apparatus 110 into a write processing command Mem_write (which may be hereinafter referred to also as Mem_write command) and supplies the write processing command Mem_write to the memory 140.

Further, the memory controller 130 converts the idle command IDL from the host apparatus 110 into a replace processing command Mem_replace (which may be hereinafter referred to also as Mem_replace command) and supplies the replace processing command Mem_replace to the memory 140.

Referring back to FIG. 4, the memory controller 130 has a function of discriminating an error which requires a replacement process from among errors included in the status information STS outputted from the memory 140 and instructing the memory 140 to carry out a replacement process for the defective memory cell.

Further, the memory controller 130 has a function of setting, where the memory system 100 is used from an application which allows an unfixed writing speed, a condition that a replacement process is started immediately when an error occurs.

The memory 140 which is controlled by the memory controller 130 includes a main memory area 141 and a replacement area 142 formed from a memory cell array, and a control unit 143 for controlling the main memory area 141 and the replacement area 142.

The control unit 143 of the memory 140 has a function of deciding an error when busy time required for writing does not come to an end within a certain fixed period of time due to a variation, that is, deterioration, of a characteristic of the memory and notifying the memory controller 130 that a defective memory cell is found.

The control unit 143 has a replacement processing function of replacing a memory cell of the main memory area 141 with which an error occurs with a memory cell in the replacement area 142. In other words, the control unit 143 has a function of storing the address of a defective memory cell and automatically changing over accessing to the defective memory cell upon address decoding to accessing to a replacement memory cell.

The control unit 143 has a storage area for saving addresses and data of defective memory cells in pairs as hereinafter described in detail, for example, a save area having a plurality of saving latches LTC.

In the save area, each of the saving latches for saving an address of a defective memory cell and data in pair includes a flag representative of whether the saving latch is in a used state or in an unused state.

The control unit 143 has a function of latching, if a defective memory cell is newly found, the address of the new defective memory cell and data for the defective memory cell into an unused region, that is, a saving latch, of the save area and setting the flag to the used state.

The control unit 143 further has a function of setting the flag to the unused state if a replacement process is carried out and the information of the save area becomes unnecessary.

It is to be noted the save area can be formed not from latches but from nonvolatile storage cells.

When a writing process is executed in response to the write command WRT, if the address for the writing coincides with an address latched in the save area, then the control unit 143 rewrites the data latched in the save area.

Consequently, even if a replacement process is not executed as yet, writing into a defective cell does not occur, and it is possible to prevent an error from being caused by the write command WRT.

On the other hand, when a reading process is executed in response to the read command RD, if the address for the reading coincides with an address latched in the save area, then the control unit 143 outputs the data latched in the save area.

Consequently, even if a replacement process is not executed as yet, reading out from a defective cell does not occur, and it is possible for the read command RD to return normal data.

The control unit 143 selects the address of the defective memory cell which should be an object of a replacement process from the values retained in the save area and sets the flag of the save area selected as the object of the replacement process based on an instruction from the memory controller 130 to the unused state.

As a result, the memory cell can be re-used when a next error occurs.

The control unit 143 has a function of latching addresses and data of all defective memory cells which appear before a replacement process is executed into the save area.

Accordingly, the capacity of the save area is set so as to be ready for write errors which may possibly appear within a period of time before it becomes possible to carry out a replacement process without disturbing writing in order to implement a writing speed higher than a fixed speed expected for the memory system.

The control unit 143 has a function of selecting a setting condition that, where the memory system 100 is used from an application which allows an unfixed writing speed, a replacement process is started immediately when an error occurs.

At this time, where the memory system 100 is used from an application which allows an unfixed writing speed, the memory controller 130 starts a replacement process immediately when an error is found as described hereinabove.

In this instance, the memory controller 130 does not receive an error which requires a replacement process from the memory 140 and accordingly does not have the necessity to issue an instruction for a replacement process.

The memory system 100 of the present embodiment is characterized in that it includes a function of continuing execution of the write command WRT at a writing speed higher than a certain fixed speed into the memory module 120 from the host apparatus 110.

In particular, the memory system 100 of the present embodiment is basically configured such that a replacement process is not carried out during execution of the write command WRT.

In the following, the functions described hereinabove are described with reference to FIGS. 6A and 6B which illustrate the characteristic of the present embodiment and FIGS. 3A and 3B which illustrate a comparative example.

A process of the comparative example is described first, and then a characteristic process of the present embodiment is described.

Execution of the Write Command WRT at a Writing Speed Higher than a Fixed Speed by the Comparative Example The comparative example relates to a system wherein data are successively outputted from the input module 21 at a rate of 2 MByte/sec and are recorded on the memory module 3 without interruption using the write command.

Although the writing speed into the memory module 3 in the example just described usually is 2.4 MByte/sec, if a replacement process is carried out, then the writing speed drops by 20% in the maximum. Therefore, the system has a specification that it includes two buffers 22A and 22B so that it maintains the writing speed of 2 MByte/sec.

The buffer section 22 includes two sides of the buffers 22A and 22B, and such operation as to transmit, during reception of data from the input module 21 by one of the sides, data of the other side to the memory module 3 is repeated alternately between the buffers 22A and 22B.

Figure 3:
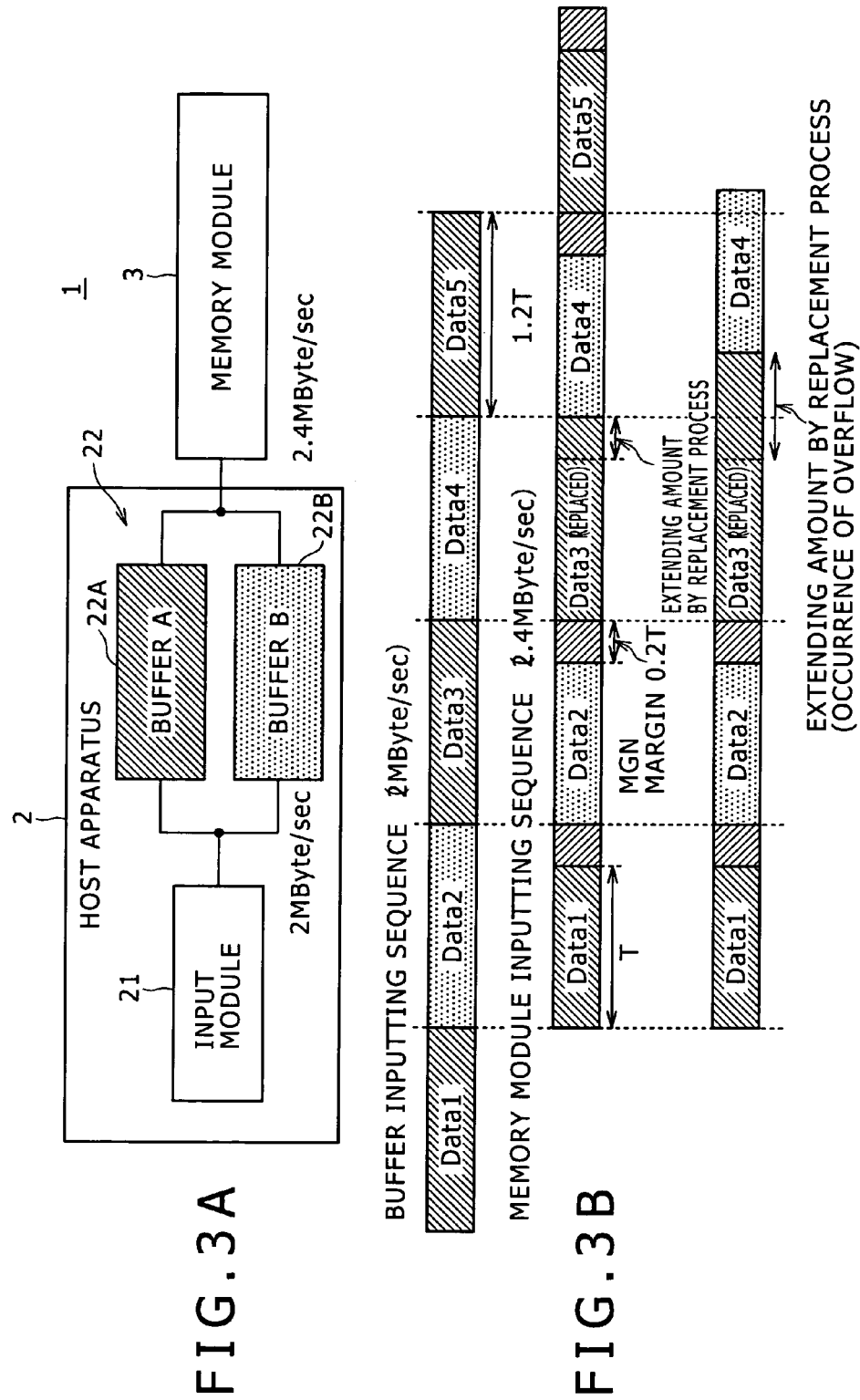
FIG. 3A is a block diagram showing an example of an existing buffer configuration and FIG. 3B is a diagrammatic view illustrating an example of a data transfer sequence.

In the example of FIG. 3B, sequences of data inputted to the buffer section 22 and inputted to the memory module 3, that is, outputted from the buffer, are illustrated.

Referring to FIG. 3B, a replacement process occurs with data Data3 to be inputted to the memory module 3, and the time required for reading is elongated. In this instance, since processing of the data Data3 is completed before writing of the data Data4 is started, the writing speed of 2 Mbyte/sec can be maintained.

In a sequence shown at the bottom of FIG. 3B, as a result of extension of the writing process of the data Data3, the writing of the next data Data4 fails to be completed before writing of next data Data5 is started and therefore a buffer overflow occurs.

Execution of the Write Command WRT at a Writing Speed Higher than a Fixed Speed in the Present Embodiment FIGS. 6A and 6B illustrate an execution process of the write command WRT at a writing speed higher than a fixed speed in the present embodiment.

In the memory system 100 of the present embodiment, since a replacement process is not carried out during execution of the write command WRT as seen in FIGS. 6A and 6B, the writing speed into the memory module 120 is stabilized at 2.4 MByte/sec.

Accordingly, a double-sided buffer provided in the host apparatus 110 side in order to maintain the writing speed of 2 MByte/sec is not required any more.

Further, it can be seen that the memory system 100 of the present embodiment can operate at a high speed of 2.4 MByte/sec in conformity with the speed of the memory module 120.

Now, an example of a particular configuration ready for a replacement process of a defective cell which appears during use of the memory 140 is described.

In the following, an example of a basic configuration of the memory 140 ready for a replacement process is described first, and then an example of a configuration of the memory 140 which has a characteristic configuration of the present embodiment is described.

Example of a Basic Configuration of the Memory Ready for a Replacement Process

Figure 7:
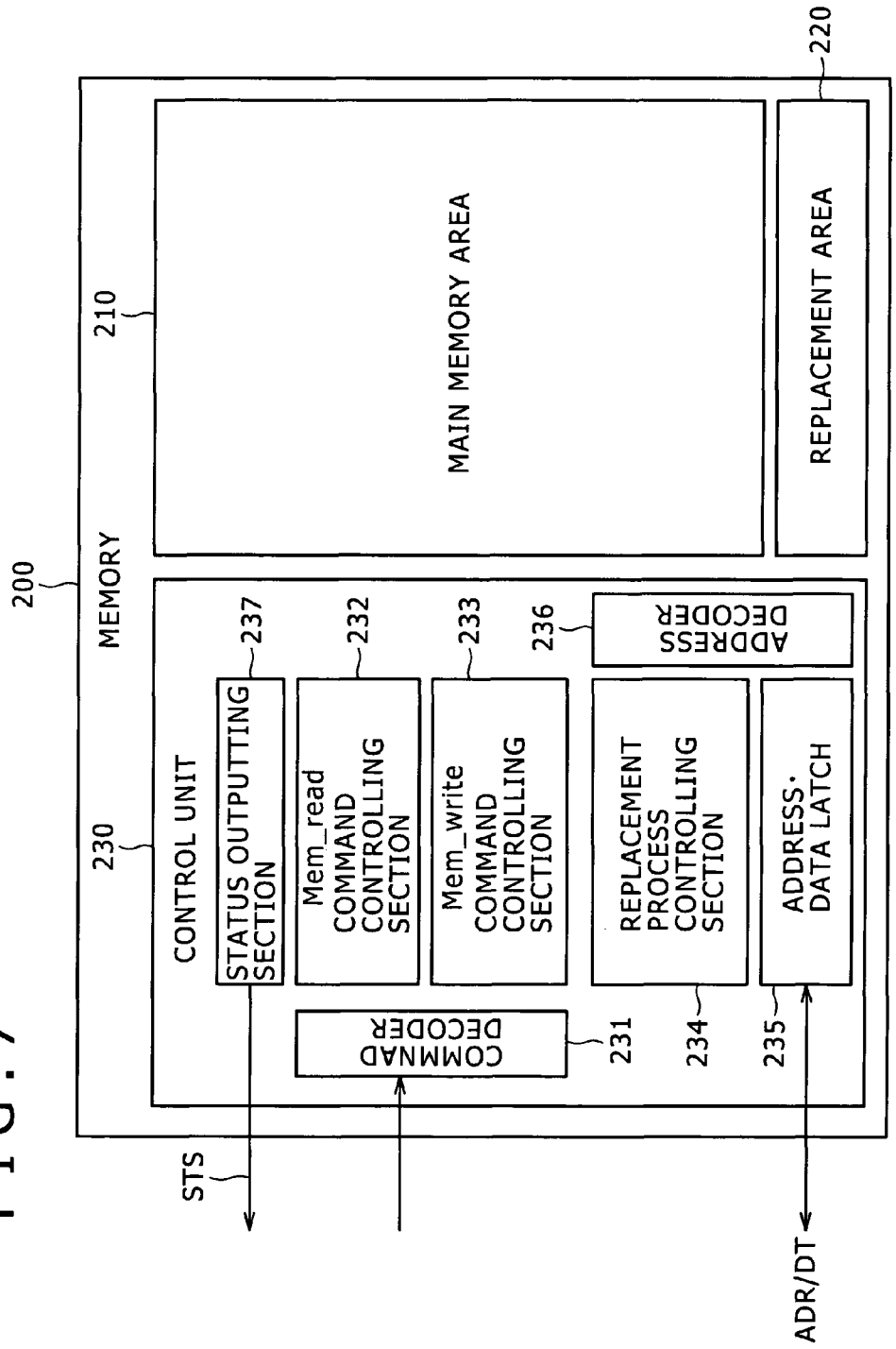
FIG. 7 is a block diagram showing an example of a basic configuration of a memory for a replacement process in the memory system of FIG. 4.

FIG. 7 shows an example of a basic configuration of a memory ready for a replacement process.

Referring to FIG. 7, the memory shown in FIG. 4 is denoted by reference numeral 200.

The memory 200 includes a main memory area 210 and a replacement area 220 which are formed from a memory cell array, and a control unit 230 for controlling the main memory area 210 and the replacement area 220.

The control unit 230 of FIG. 7 includes a command decoder 231 for decoding a command received from the memory controller 130, and a read (Mem_read) command controlling section 232, a write (Mem_write) command controlling section 233 and a replacement process controlling section 234 corresponding to the commands.

Further, the control unit 230 includes an address data latch 235, an address decoder 236, and a status outputting section 237 for outputting status information STS of the memory to the memory controller 130.

The Mem_write command controlling section 233 carries out verify reading during writing into a memory cell and generates an error signal ERR if coincidence of data is not detected during a fixed number of times of such verify reading.

The control unit 230 includes the replacement process controlling section 234 which carries out a replacement process when a verify error occurs.

The address of a defective memory cell for which a replacement process has been carried out is stored into the address decoder 236, and accessing to the address of all defective memory cells is automatically changed over to accessing to the replacement area 220.

An address ADR inputted from the memory controller 130 is inputted to the address decoder 236, by which a selection signal for an appropriate cell is generated.

Figure 1:
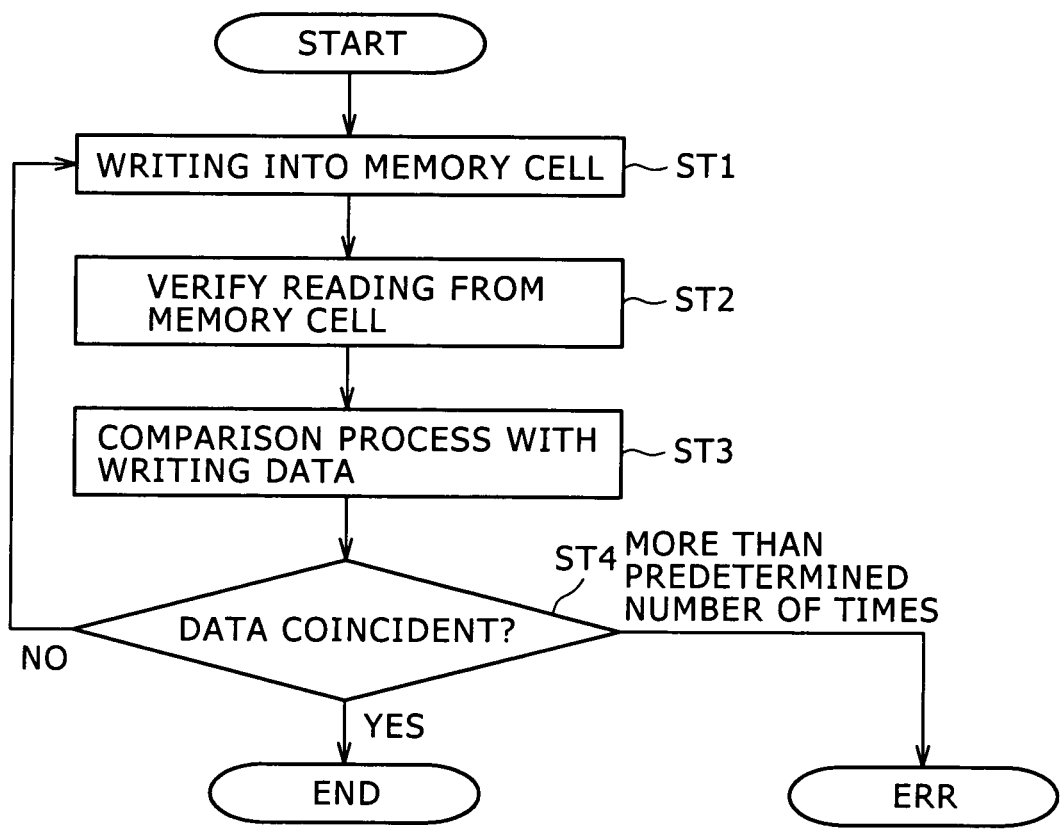
FIG. 1 is a flow chart illustrating a writing process into a memory cell.
Figure 2:
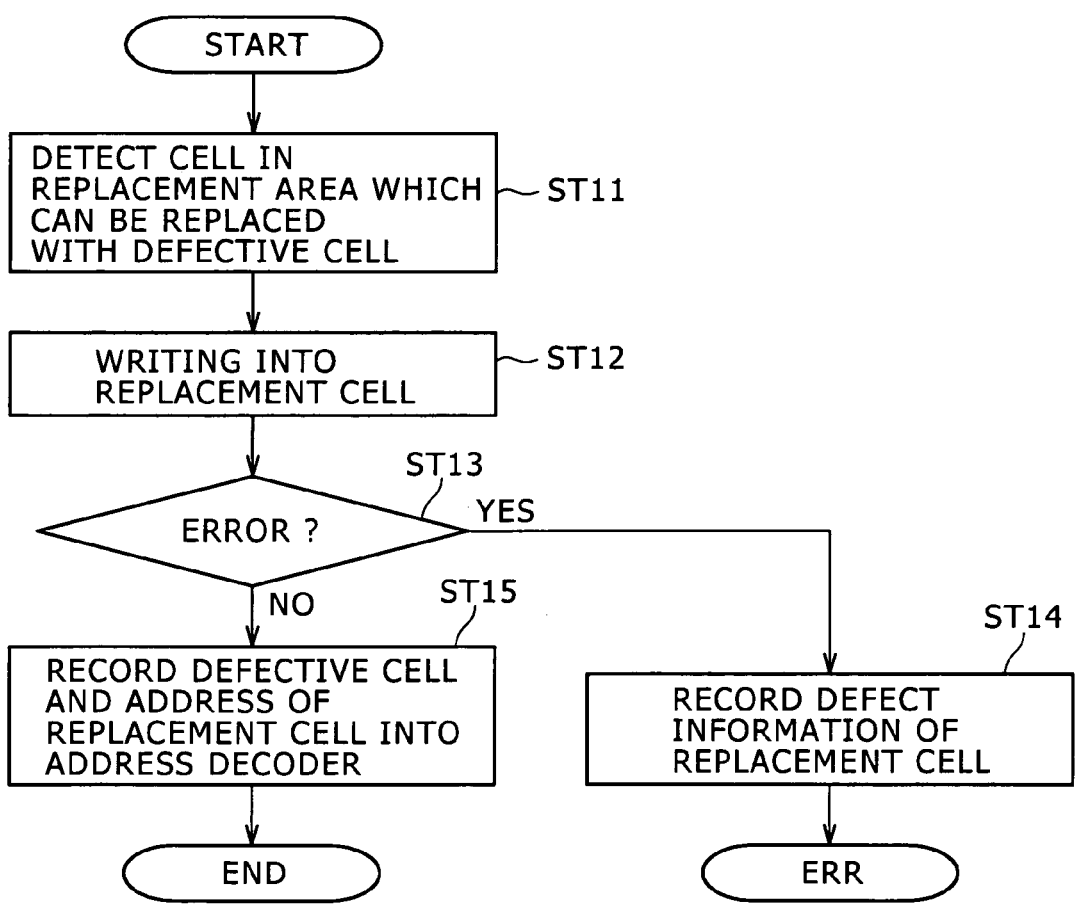
FIG. 2 is a flow chart illustrating a replacement process proposed already.

Writing into a memory cell carried out by the Mem_write command controlling section 233 in the memory 200 of FIG. 7 is carried out, for example, in accordance with the processing flow of FIG. 1.

In particular, referring to FIG. 1, the Mem_write command controlling section 233 carries out writing into a memory cell at step ST1 and carries out verify reading at step ST2, whereafter it carries out a comparison process between the read data and the write data at step ST3.

If coincidence of the data is found by the comparison process at step ST4, then the processing is ended, but if such coincidence is not found, then the Mem_write command controlling section 233 repeats the process beginning with the processing at step ST1 until coincidence of the data is found or until the processing operations at steps ST1 to ST3 are repeated by a prescribed number of times.

In this manner, the series of processing operations is repeated by the predetermined number of times until after the writing is carried out correctly. Any memory cell with regard to which coincidence of data is not found even if the sequence of operations is carried out by more than the predetermined number of times is decided as a defective cell whose characteristic is deteriorated.

As a result, the Mem_write command controlling section 233 notifies the replacement process controlling section 234 of an error of the writing process and starts a replacement process.

Figure 8:
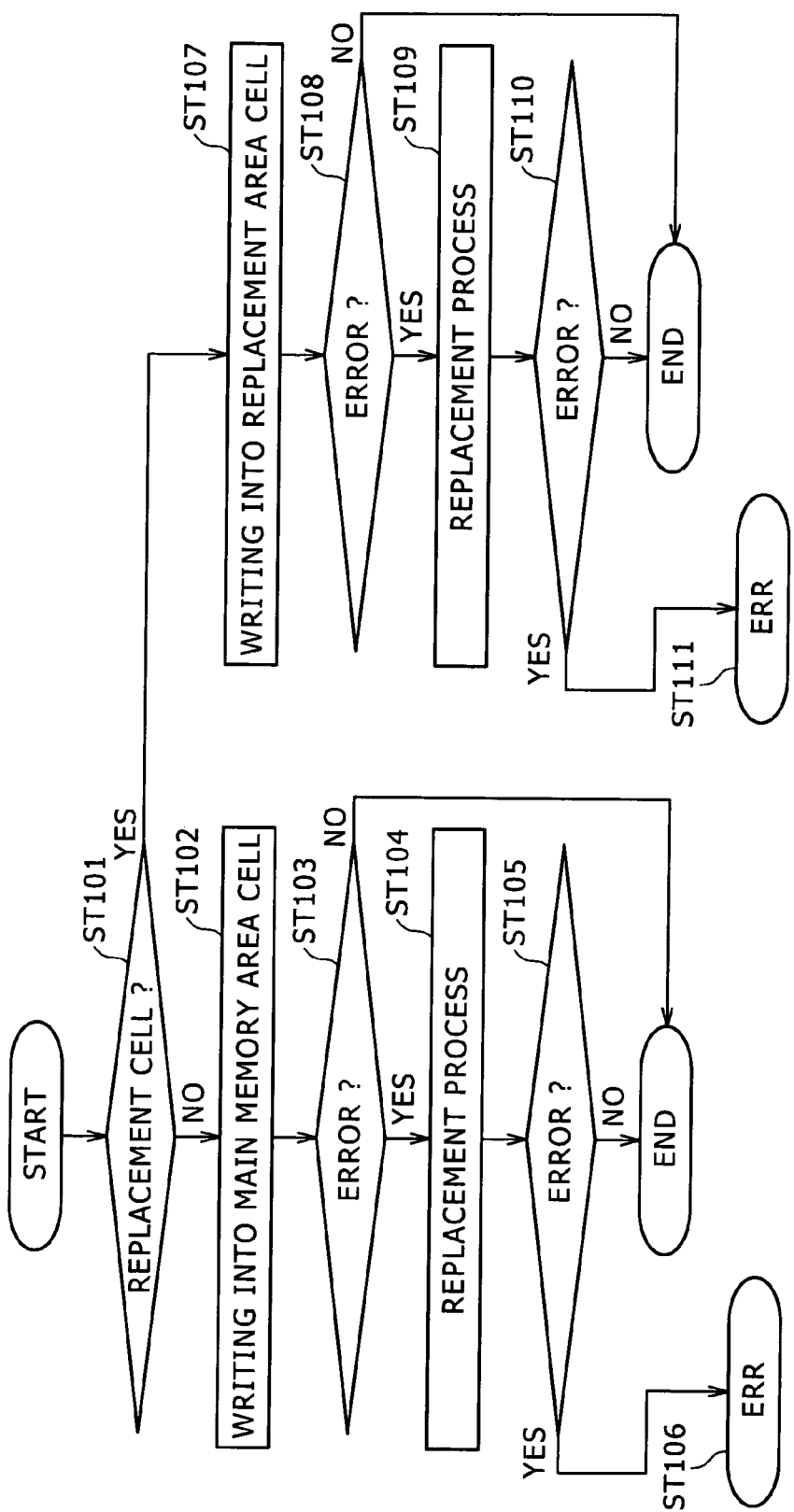
FIG. 8 is a flow chart illustrating a process for a Mem_write command carried out by a Mem_write command controlling section of the memory shown in FIG. 7.

FIG. 8 illustrates a processing flow of the Mem_write command carried out by the Mem_write command controlling section of the memory of FIG. 7.

The process in this instance includes also the writing process into a memory cell described above and a replacement process carried out by the replacement process controlling section 234.

First in the flow, it is decided by the address decoder 236 whether the memory cell belongs to the main memory area 210 or the replacement area 220. If writing into the cell results in failure and also a replacement process results in failure, an error signal ERR is returned.

In the memory 200 of FIG. 7, even if the first writing results in failure, if the replacement process results in success, then a signal representative of the success is returned to the memory controller 130.

In particular, referring to FIG. 8, the Mem_write command controlling section 233 first decides at step ST101 whether or not the memory cell is a replacement cell.

If the memory cell is not a replacement process, then the Mem_write command controlling section 233 carries out writing into the memory cell of the main memory area 210 at step ST102.

Then at step ST103, the Mem_write command controlling section 233 decides whether or not an error has occurred. If an error has occurred, then the Mem_write command controlling section 233 issues a notification of such occurrence of an error to the replacement process controlling section 234.

The replacement process controlling section 234 receives the error signal and carries out a replacement process at step ST104 and then decides at step ST105 whether or not an error has occurred.

If an error has occurred, then the replacement process controlling section 234 outputs an error signal ERR at step ST106.

On the other hand, if it is decided at step ST101 that the memory cell is a replacement process, then the Mem_write command controlling section 233 carries out writing into the memory cell in the replacement area 220 at step ST107.

Then, the Mem_write command controlling section 233 decides at step ST108 whether or not an error has occurred. If an error has occurred, then the Mem_write command controlling section 233 issues a notification of such occurrence of an error to the replacement process controlling section 234.

The replacement process controlling section 234 receives the error signal and carries out a replacement process at step ST109 and then decides at step ST110 whether or not an error has occurred.

If an error has occurred, then the replacement process controlling section 234 outputs an error signal ERR at step ST111.

The replacement process by the replacement process controlling section 234 is carried out in the following manner.

The replacement process controlling section 234 searches out a cell which can be replaced with the defective cell from within the replacement area. Then, if writing into the replacement cell results in success, then the replacement process controlling section 234 stores the addresses of the defective cell and the replacement cell into the address decoder 236 so that later accessing to the defective cell is changed over to that to the replacement cell.

Figure 9:
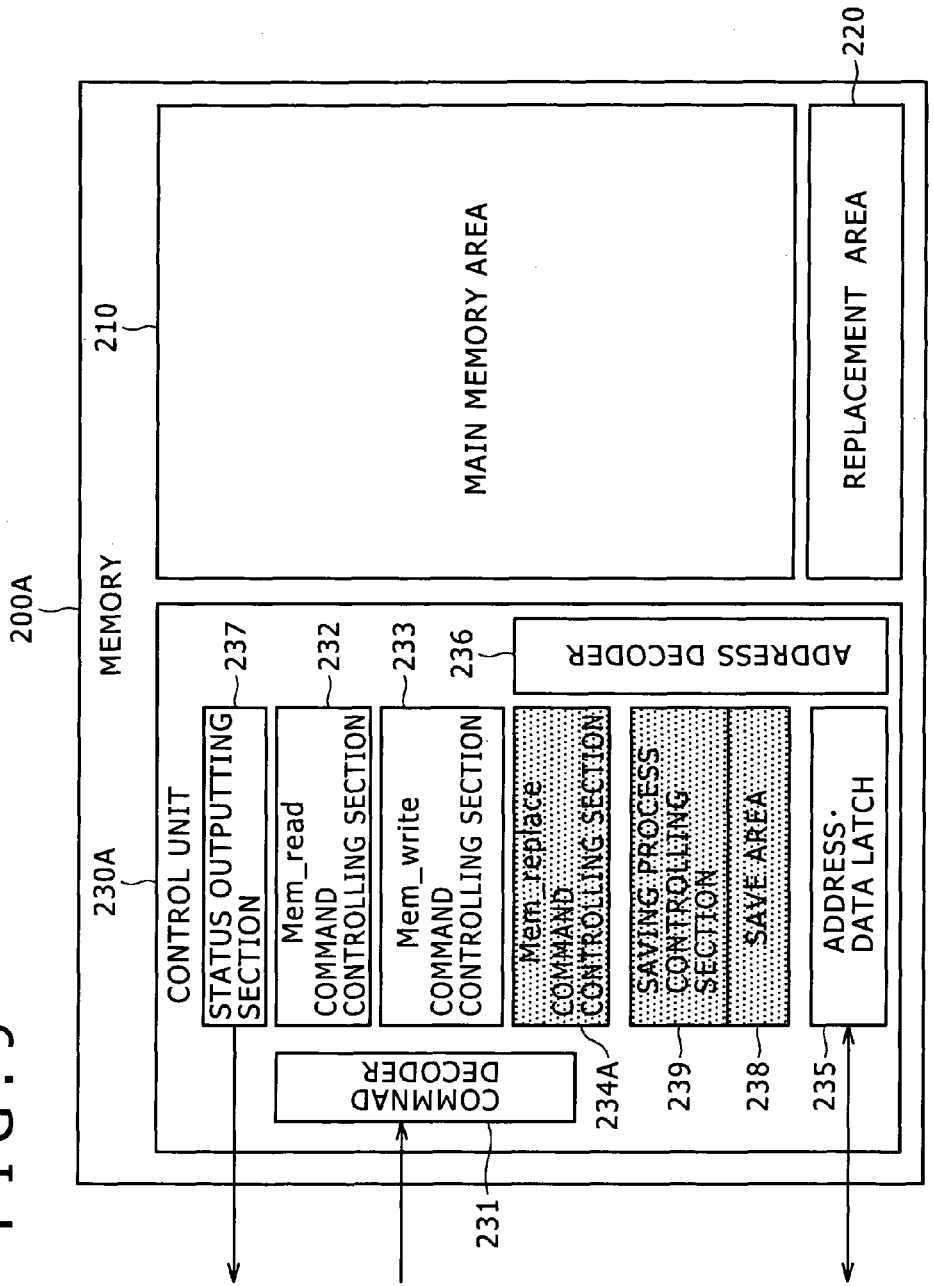
FIG. 9 is a block diagram showing an example of a characteristic configuration of the memory of the memory system of FIG. 4 which is ready for the replacement process.

Example of a Characteristic Configuration of a Memory Ready for a Replacement Process FIG. 9 shows an example of a characteristic configuration of the memory ready for a replacement process according to the first embodiment.

Referring to FIG. 9, a memory 200A shown is different in the following two points from the memory 200 described hereinabove with reference to FIG. 7.

The first difference is that a control unit 230A of the memory 200A includes a save area 238 and a saving process controlling section 239.

The second difference is that the control unit 230A includes a Mem_replace (replacement process) command controlling section 234A in place of the replacement process controlling section 234.

In short, the memory 200A of FIG. 9 executes also a replacement process in accordance with an instruction of the Mem_replace command from the memory controller 130.

The save area 238 of FIG. 9 is formed from a plurality of latches (hereinafter referred to as saving latches) for saving, when a write error by characteristic deterioration of a memory cell occurs, the address of the defective cell and write data.

The saving process controlling section 239 has a detection function of detecting an unused latch from among the saving latches and a write/read controlling function for the saving latches.

Further, the saving process controlling section 239 has a function of comparing the addresses of defective cells retained in the saving latches in the unused state and an address inputted from the outside with each other and changing over, if coincidence is detected, the accessing to accessing to the save area 238.

In the following, the Mem_write command process, Mem_read command process, saving process and replacement process of the memory 200A of FIG. 9 are described in detail.

Figure 10:
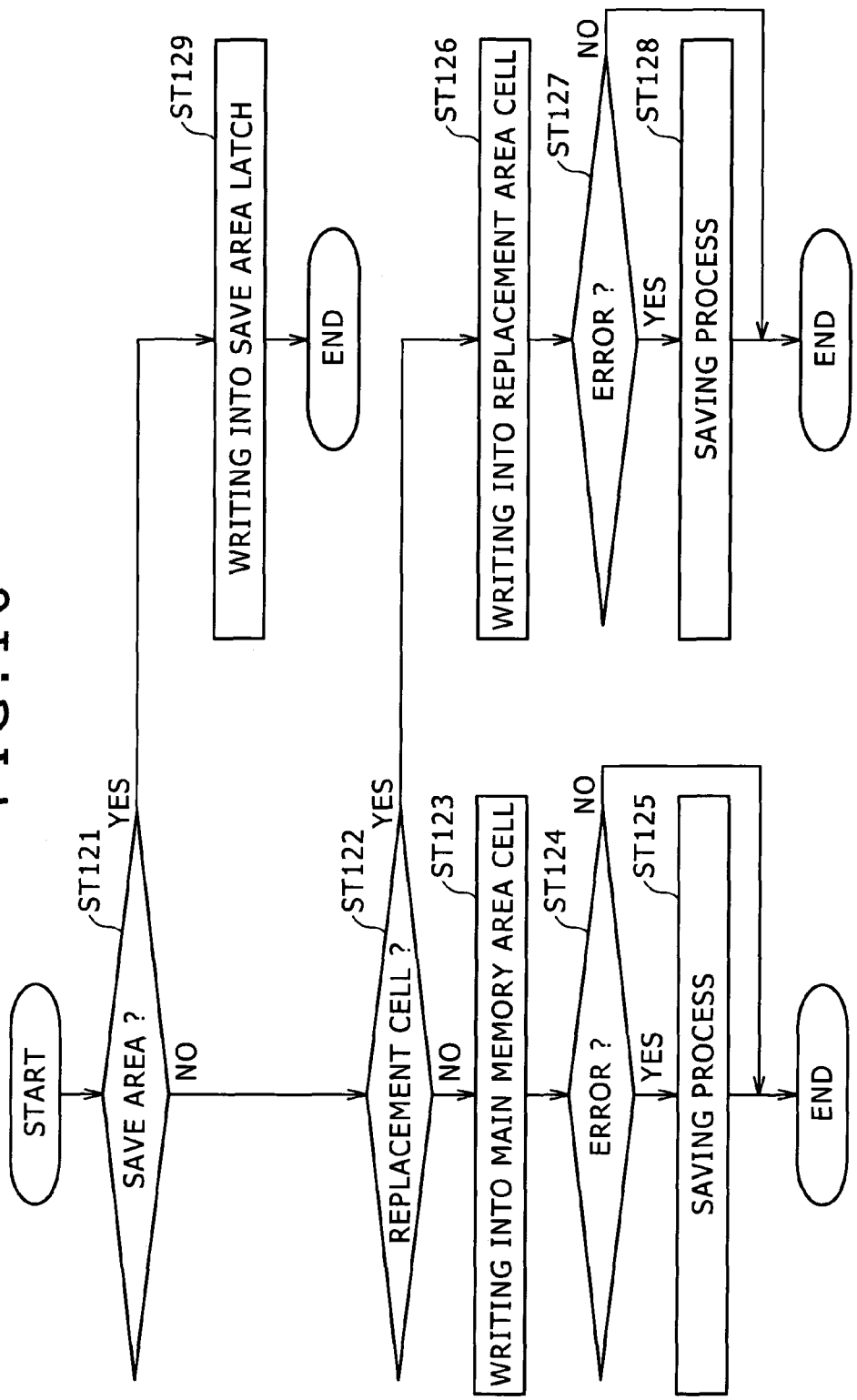
FIG. 10 is a flow chart illustrating a process for the Mem_write command carried out by a Mem_write command controlling section of the memory shown in FIG. 9.

FIG. 10 illustrates a processing flow of the Mem_write command carried out by the Mem_write command controlling section of the memory of FIG. 9.

The processing flow of FIG. 10 is same as the processing flow of FIG. 8 except the following point.

The processing flow of FIG. 10 is characterized in that it includes an additional step for confirming whether or not an accessed cell is allocated to a saving latch by address comparison and includes a saving process in place of the replacement process in FIG. 8.

In particular, the Mem_write command controlling section 233 first confirms by address comparison at step ST121 whether or not an accessed cell is allocated to a saving latch of the save area 238.

If the accessed cell is not allocated to any saving latch of the save area 238, then the Mem_write command controlling section 233 decides whether or not the accessed cell is a replacement cell at step ST122.

If the access cell is not a replacement cell, then the Mem_write command controlling section 233 carries out writing into the memory cell of the main memory area 210 at step ST123.

Then at step ST124, the Mem_write command controlling section 233 decides whether or not an error has occurred. If an error has occurred, then the Mem_write command controlling section 233 issues a notification of such occurrence of an error to the saving process controlling section 239, and a saving process is carried out under the control of the saving process controlling section 239 at step ST125.

On the other hand, if it is decided at step ST122 that the accessed cell is a replacement process, then the Mem_write command controlling section 233 carries out writing into the memory cell of the replacement area 220 at step ST126.

Then at step ST127, the Mem_write command controlling section 233 decides whether or not an error has occurred. If an error has occurred, then the Mem_write command controlling section 233 issues a notification of such occurrence of an error to the saving process controlling section 239, and a saving process is carried out under the control of the saving process controlling section 239 at step ST128.

On the other hand, if it is decided at step ST121 that the accessed cell is allocated to a saving latch of the save area 238, then the saving process controlling section 239 carries out writing into the saving latch of the save area 238 at step ST129.

Figure 11:
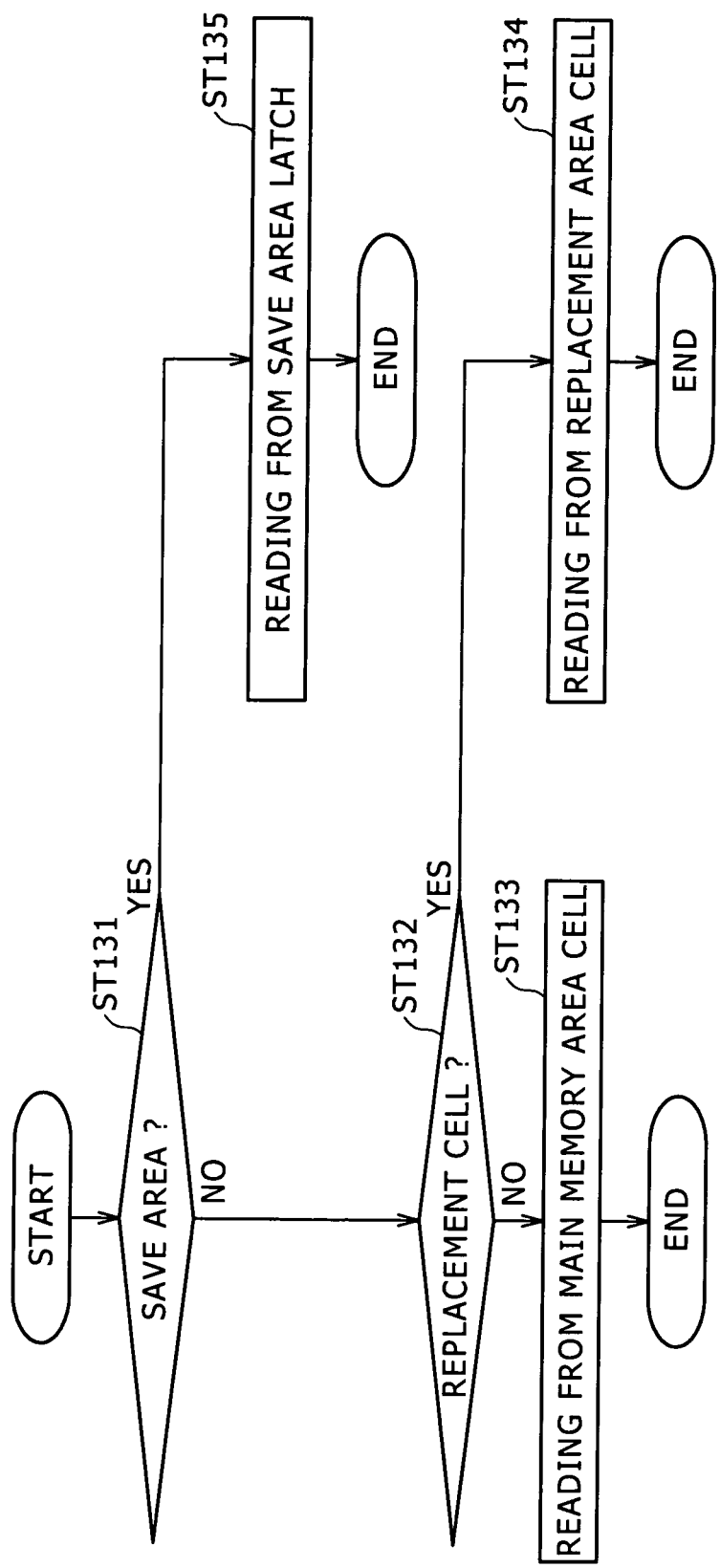
FIG. 11 is a flow chart illustrating a process for a Mem_read command carried out by a Mem_read command controlling section of the memory shown in FIG. 9.

FIG. 11 illustrates a processing flow of the Mem_read command carried out by the Mem_read command controlling section of the memory of FIG. 9.

Also the processing flow of FIG. 11 includes a step of confirming whether an accessed cell is allocated to a saving latch by address comparison.

In particular, referring to FIG. 11, the Mem_read command controlling section 232 first confirms by address comparison at step ST131 whether or not the accessed cell is allocated to a saving latch of the save area 238.

If the accessed cell is not allocated to any saving latch of the save area 238, then the Mem_read command controlling section 232 decides whether or not the accessed cell is a replacement cell at step ST132.

If the accessed cell is not a replacement cell, then the Mem_read command controlling section 232 carries out reading from the memory cell of the main memory area 210 at step ST133.

However, if the Mem_read command controlling section 232 decides at step ST122 that the accessed cell is a replacement cell, then it carries out reading from the memory cell of the replacement area 220 at step ST134.

On the other hand, if it is decided at step ST131 that the accessed cell is allocated to any of the replacement latches of the save area 238, then the saving process controlling section 239 carries out reading from the replacement latch of the save area 238 at step ST135.

Figure 12:
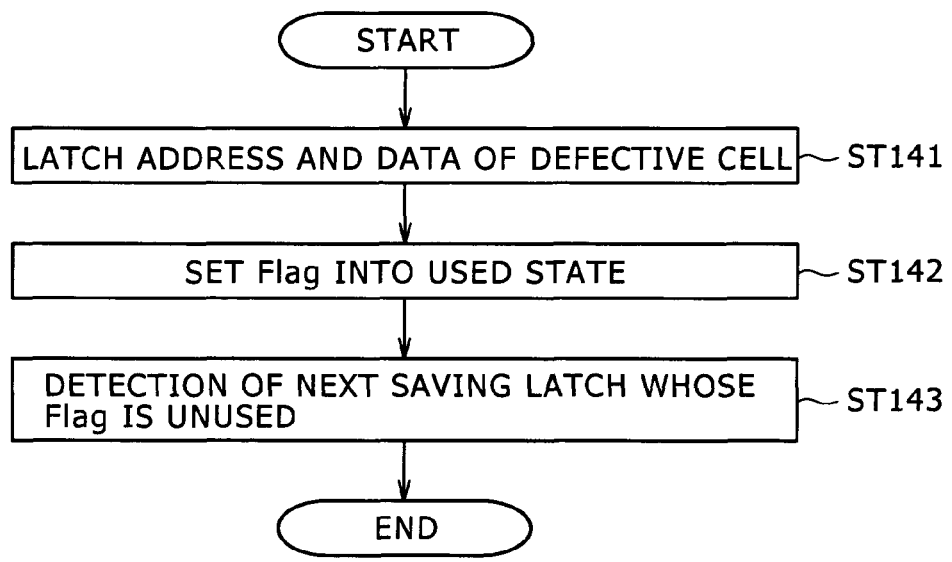
FIG. 12 is a flow chart illustrating a saving process carried out by a saving process controlling section of the memory system of FIG. 4.

FIG. 12 illustrates a processing flow of the saving process carried out by the saving process controlling section in the present embodiment.

Figure 13:
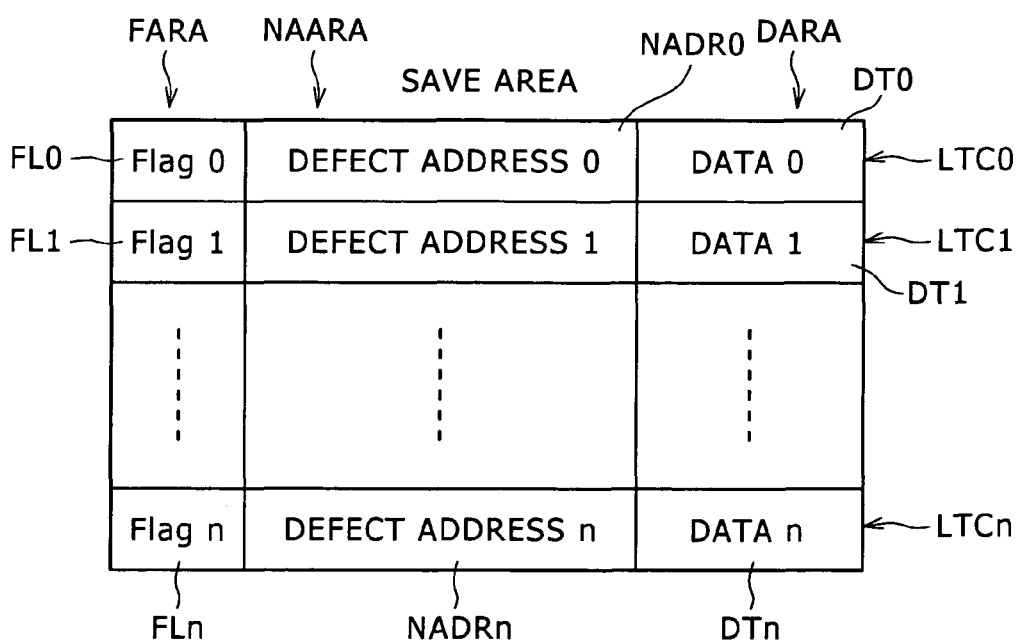
FIG. 13 is a view illustrating an example of a save area of the saving process controlling section shown in FIG. 4.

FIG. 13 illustrates an example of the replacement area in the present embodiment.

Referring first to FIG. 13, the save area 238 includes a plurality of saving latches LTC0 to LTCn which form a storage or retaining area.

Each of the saving latches LTC0 to LTCn includes a flag region FARA, a defect address latch region (defect address save area) NAARA and a data latch region (data save area) DARA.

To the flag regions FARA, for example, 1-bit flags FL0 to FLn are set.

If any of the flags FL0 to FLn has, for example, "0" set thereto, then this indicates that the corresponding saving latch LTC is "unused," but if it has "1" set thereto, then this indicates that the saving latch LTC is "used."

In the defect address latch regions NARRA, defect addresses NADR0 to NADRn are latched, respectively.

In the data latch regions DARA, data DT0 to DTn corresponding to the defect addresses NADR0 to NADRn are latched, respectively.

The saving latches LTC0 to LTCn allow high speed reading and writing similarly to latches used normally in memories.

The saving process prepares a saving latch LTC in an unused state which should be used subsequently by the save area 238.

If an error which requires a saving process occurs, then the flag FL which indicates a use state of the saving latch LTC is set to "used," in the present example, to "1," and the address of the defective cell and the data which should have been stored into the address are stored into the saving latch LTC (steps ST141 to ST143).

By the process, also when a write error occurs, the processing is completed at a high speed.

After the replacement process is completed thereafter, the flag FL corresponding to the saving latch LTC is re-set to the "unused" state, in the present example, to "0," so that the saving latch LTC is re-used.

Now, the replacement process is described.

Figure 14:
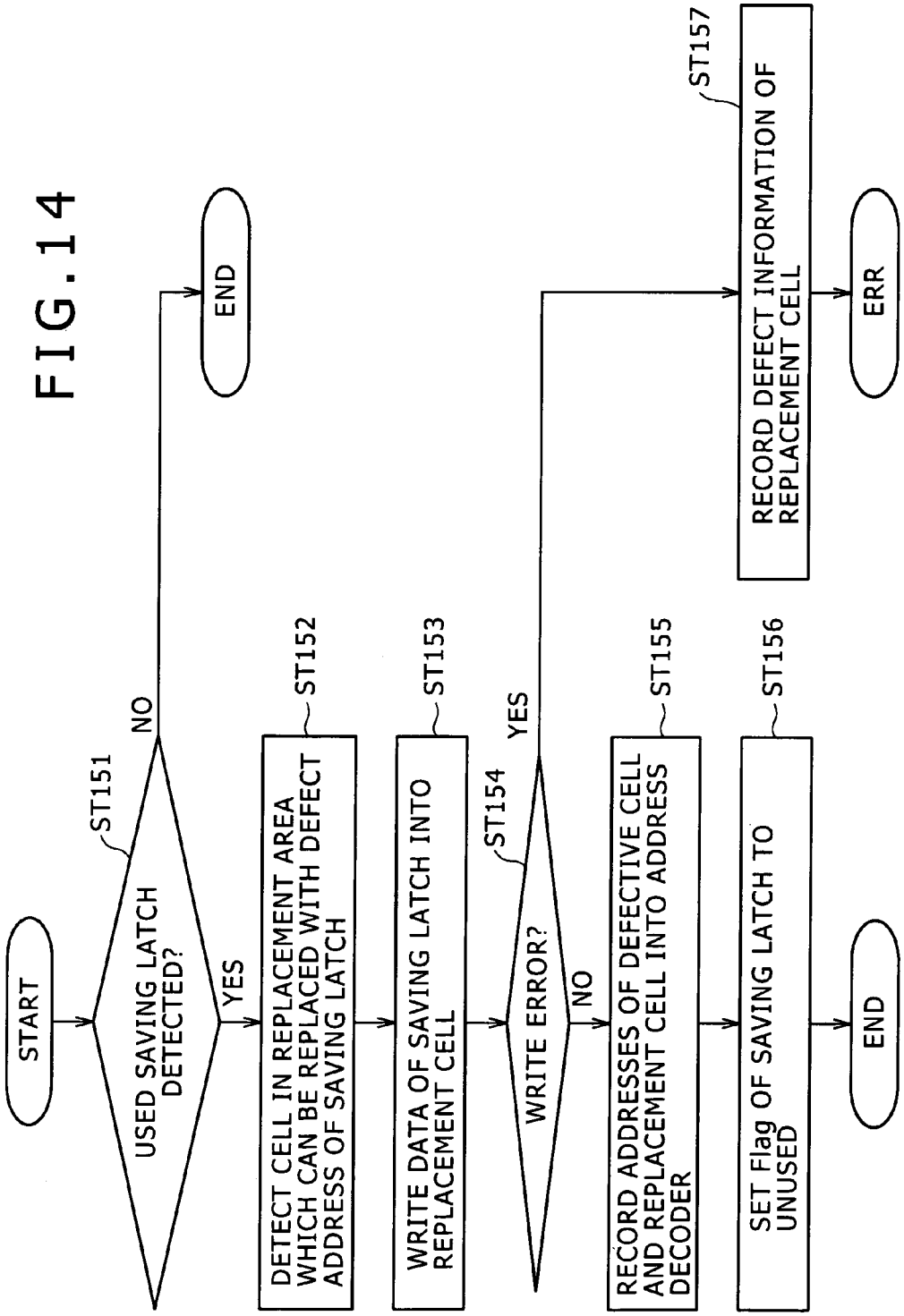
FIG. 14 is a flow chart illustrating the replacement process carried out by the memory system of FIG. 4.

FIG. 14 illustrates a processing flow of the replacement process in the present embodiment.

First at step ST151, the Mem_replace command controlling section 234A carries out, for example, through the saving process controlling section 239, detection of whether or a saving latch LTC in a used state exits.

In this instance, if a saving latch LTC in a used state does not exist, then the Mem_replace command controlling section 234A immediately ends the replacement process.

On the other hand, if a saving latch LTC in a used state exists, then the Mem_replace command controlling section 234A determines, at step ST152, an address of a cell in the replacement area 220 which can be used for replacement from the defect address NADR latched in the saving latch LTC to detect a replacement cell in the replacement area 220.

Then, the Mem_replace command controlling section 234A writes the data DT on the saving latch LTC into the replacement cell at step ST153.

Then at step ST154, the Mem_replace command controlling section 234A discriminates whether or not a writing error has occurred.

If a writing error has not occurred and the writing into the replacement cell results in success, then the Mem_replace command controlling section 234A records, at step ST155, the addresses of the defective cell and the replacement cell into the address decoder 236 to render accessing to the replacement cell upon address decoding effective.

Finally at step ST156, the flag FL of the saving latch LTC is cleared into an unused state, that is, set to "0," thereby to complete the replacement process.

It is to be noted that, if a writing error has occurred at step ST154, then defect information of the replacement cell is recorded at step ST157.

As a characteristic of the present embodiment, also the replacement process is started in response to an instruction from the host apparatus 110 and the memory controller 130.

Now, a more particular example of the saving process according to the present embodiment is described.

Figure 15:
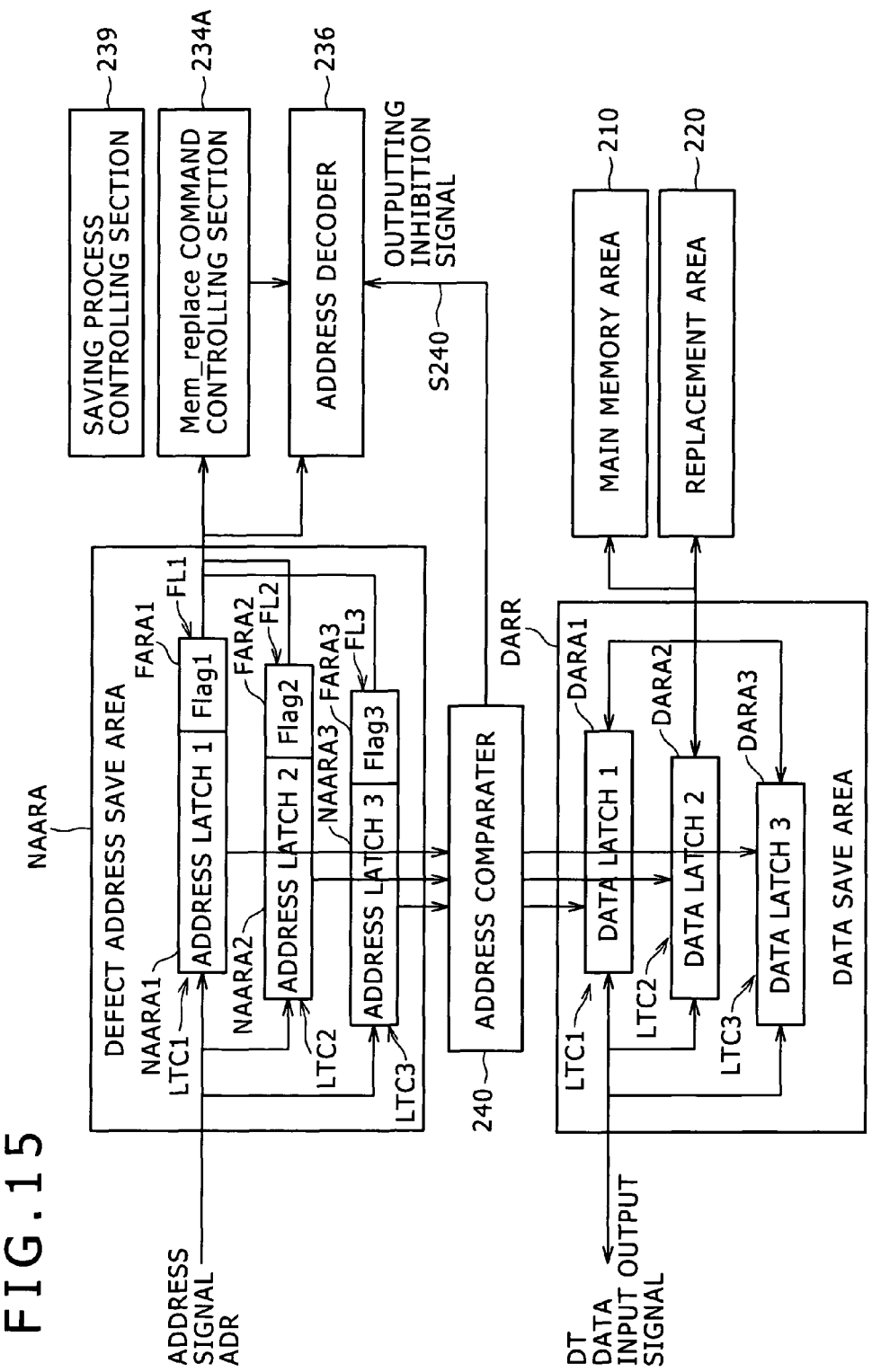
FIG. 15 is a block diagram illustrating a basic concept of a particular example of the replacement process illustrated in FIG. 14.

FIG. 15 illustrates a basic concept of a particular example of the saving process.

Referring to FIG. 15, in the example illustrated, the three saving latches LTC1 to LTC3 of the save area 238 are used.

The saving latch LTC1 includes a flag region FARA1, an address latch region NAARA1 and a data latch region DARA1.

The saving latch LTC2 includes a flag region FARA2, an address latch region NAARA2 and a data latch region DARA2.

The saving latch LTC3 includes a flag region FARA3, an address latch region NAARA3 and a data latch region DARA3.

The address latch regions NAARA1 to NAARA3 are connected at an input terminal thereof to a supply line of an address signal ADR by the memory controller 130.

The address latch regions NAARA1 to NAARA3 are connected at an output terminal thereof to an address comparator 240.

The address comparator 240 carries out comparison of addresses latched in the address latch regions NAARA1 to NAARA3. In particular, the address comparator 240 compares all of those of the address latches of the save area 238 which indicate the flag state of "used."

If coincidence of such addresses is detected, then the address comparator 240 outputs an output inhibition signal S240 for inhibiting outputting of a selection signal to the address decoder 236, main memory area 210 and replacement area 220.

Figure 16:
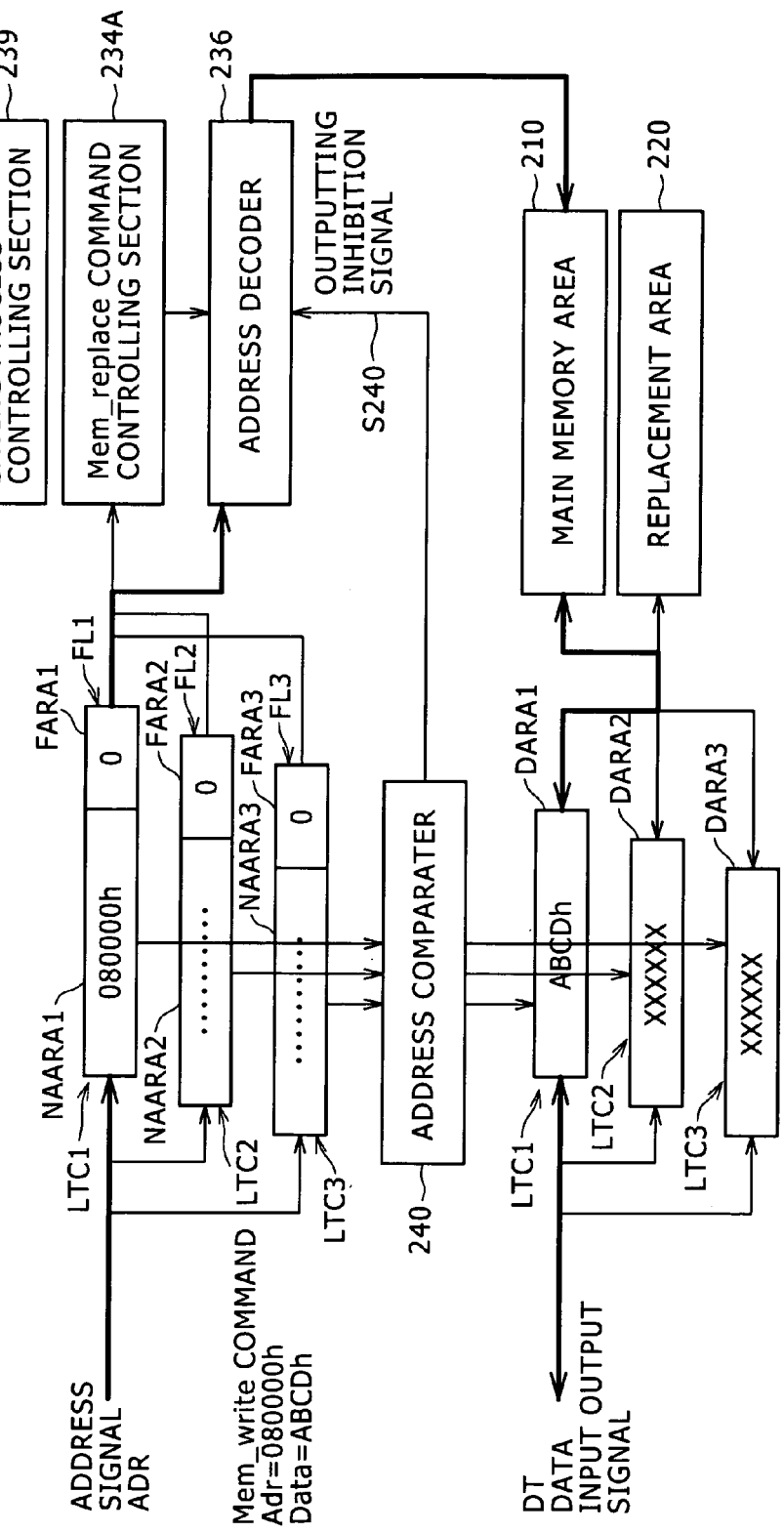
FIGS. 16, 17 and 18 are block diagrams illustrating first, second and third particular examples, respectively, associated with the basic concept illustrated in FIG. 15.
Figure 17:
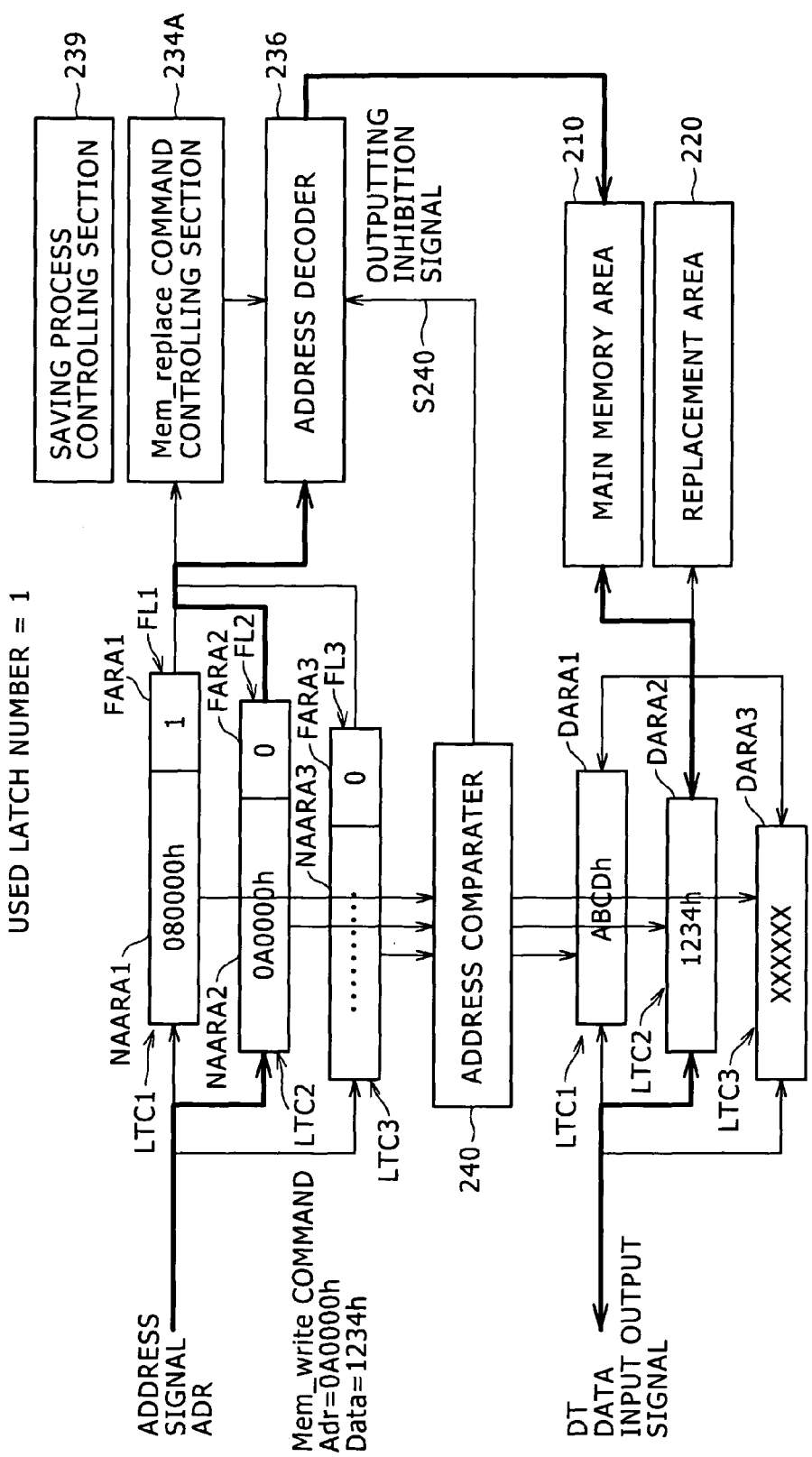

FIGS. 16 and 17 show first and second particular examples of the configuration of the basic concept of FIG. 14, respectively.

Referring first to FIG. 16, in the example shown, all of the saving latches LTC1 to LTC3 remain in an unused initial state, and one of the saving latches LTC1 to LTC3 is normally used for address inputting and data inputting and outputting from and to the memory controller 130 while the flag FL of the saving latch remains in the unused state.

In the example, the address Adr inputted by the address signal ADR is "080000h" and the data DT is "ABCDh."

If a write error occurs during execution of the Mem_write command from the memory controller 130, then the flag FL is set to a used state (FL=1) and the address latch region NAARA1 and the data latch region DARA1 are placed into a state wherein they retain the values.

Also in the example of FIG. 16, if a write error occurs, then the flag FL1 of the flag region FARA1 is set to a used state (FL=1) as seen in FIG. 17, and the values of the address latch region NAARA1 and the data latch region DARA1 are retained.

Upon subsequent accessing, the saving latch LTC2 is used for inputting, and the address Adr inputted to the saving latch LTC2 is normally compared with the address latched in the address latch region NAARA1 of the saving latch LTC1 by the address comparator 240.

Figure 18:
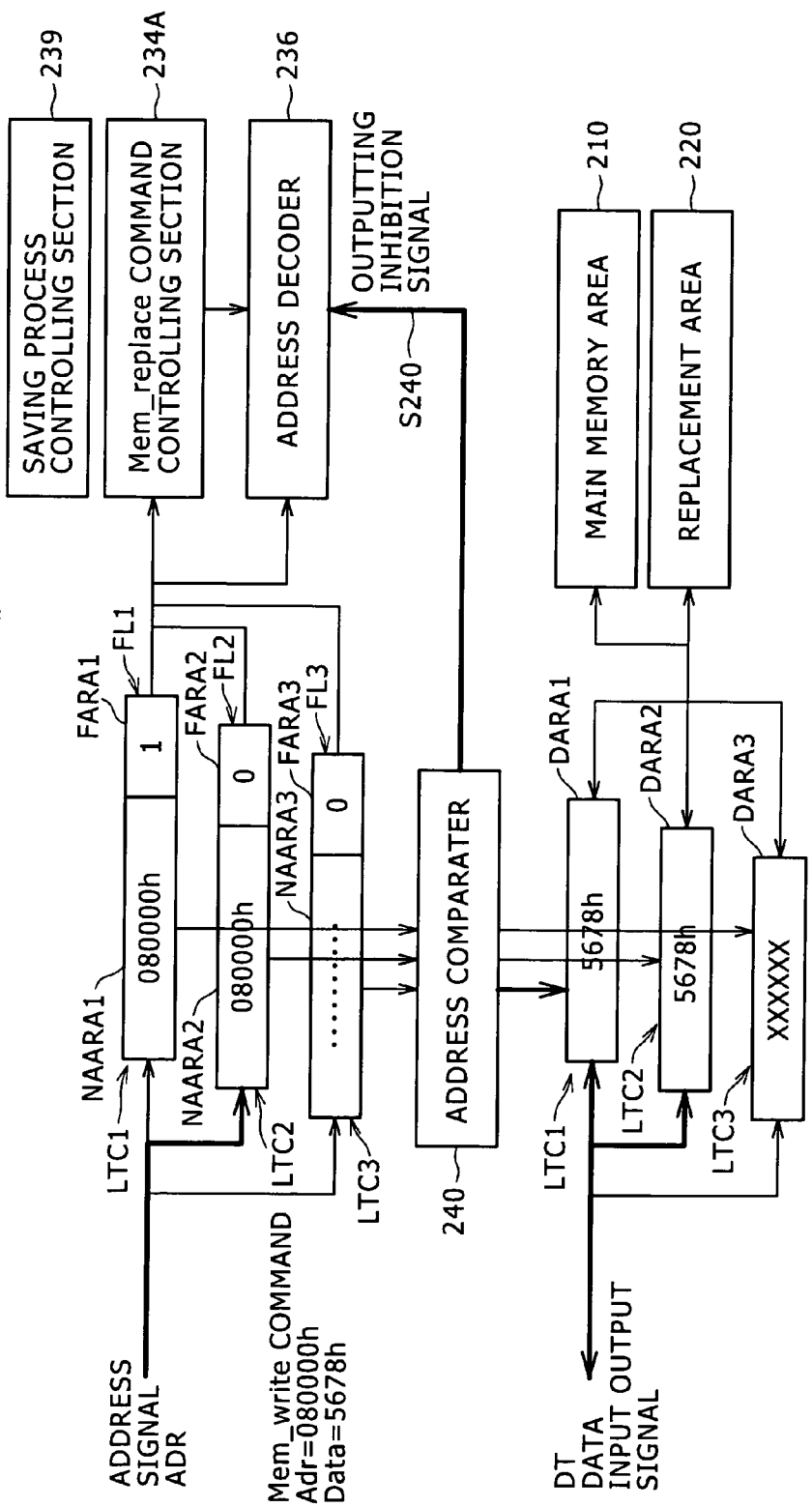

FIG. 18 shows a third particular example of the configuration of the basic concept of FIG. 14.

Referring to FIG. 18, in the process of the Mem_write command, if it is detected by the address comparator 240 that the address to the saving latch LTC2 coincides with the address in the address latch region NAARA1 of the saving latch LTC1, then the value of the data latch region DARA1 is changed.

According to the configuration of FIG. 18, addresses regarding three errors in the maximum can be latched into the save area 238. However, if all of the three saving latches LTC1 to LTC3 are in an used state, then a next address and a next command cannot be received, and it is necessary to carry out a replacement process in order to make one saving latch in an unused state available.

Further, in the memory shown in FIG. 18, the saving process controlling section 239 manages the number of saving latches which are in a used state.

The memory shown in FIG. 18 returns the number of saving latches as the status information STS of use from the status outputting section 237 to the memory controller 130.

Consequently, the memory controller 130 can grasp the number of defect addresses and data included in the save area 238 and can decide by what number of times a replacement process is required before all replacement processes are completed.

Since the replacement process is described hereinabove with reference to FIG. 14, description of a particular processing flow of the replacement process is omitted herein to avoid redundancy.

Now, a flow of operations of replacement process instruction of the memory controller side which controls the memory is described.

Figure 19:
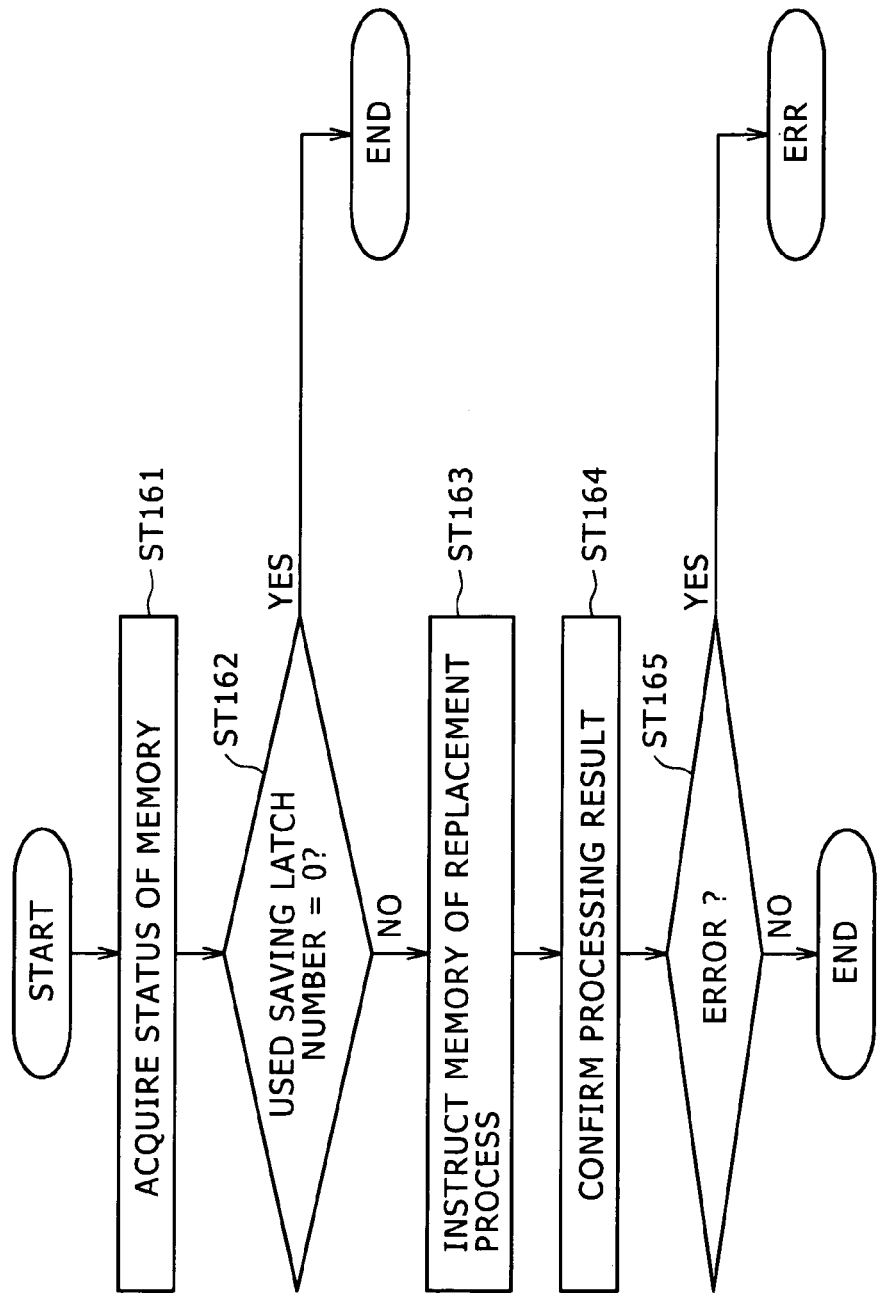
FIG. 19 is a flow chart illustrating a replacement process instruction process of a controller side for controlling a memory shown in FIG. 15.

FIG. 19 illustrates a flow of operations in replacement process instruction of the controller side which controls a memory configured in the basic concept described hereinabove with reference to FIG. 15.

A use state of the save area is acquired in advance from a state of the memory to decide whether or not instruction for a replacement process is required.

Referring to FIG. 19, the memory controller 130 first acquires at step ST161 the status information STS of the memory 200A from the status outputting section 237 of the memory 200A.

Then at step ST162, the memory controller 130 decides from the acquired status information STS whether or not the number of the saving latches which are in a used state in the memory 200A is zero.

If it is decided that the number of the saving latches in a used state is not zero, then the memory controller 130 issues an instruction of a replacement process to the memory 200A at step ST163.

Then, the memory controller 130 confirms a result of the processing at step ST164 and decides whether or not an error has occurred at step ST165.

Then, if an error has occurred, then the memory controller 130 outputs an error signal ERR.

Figure 20:
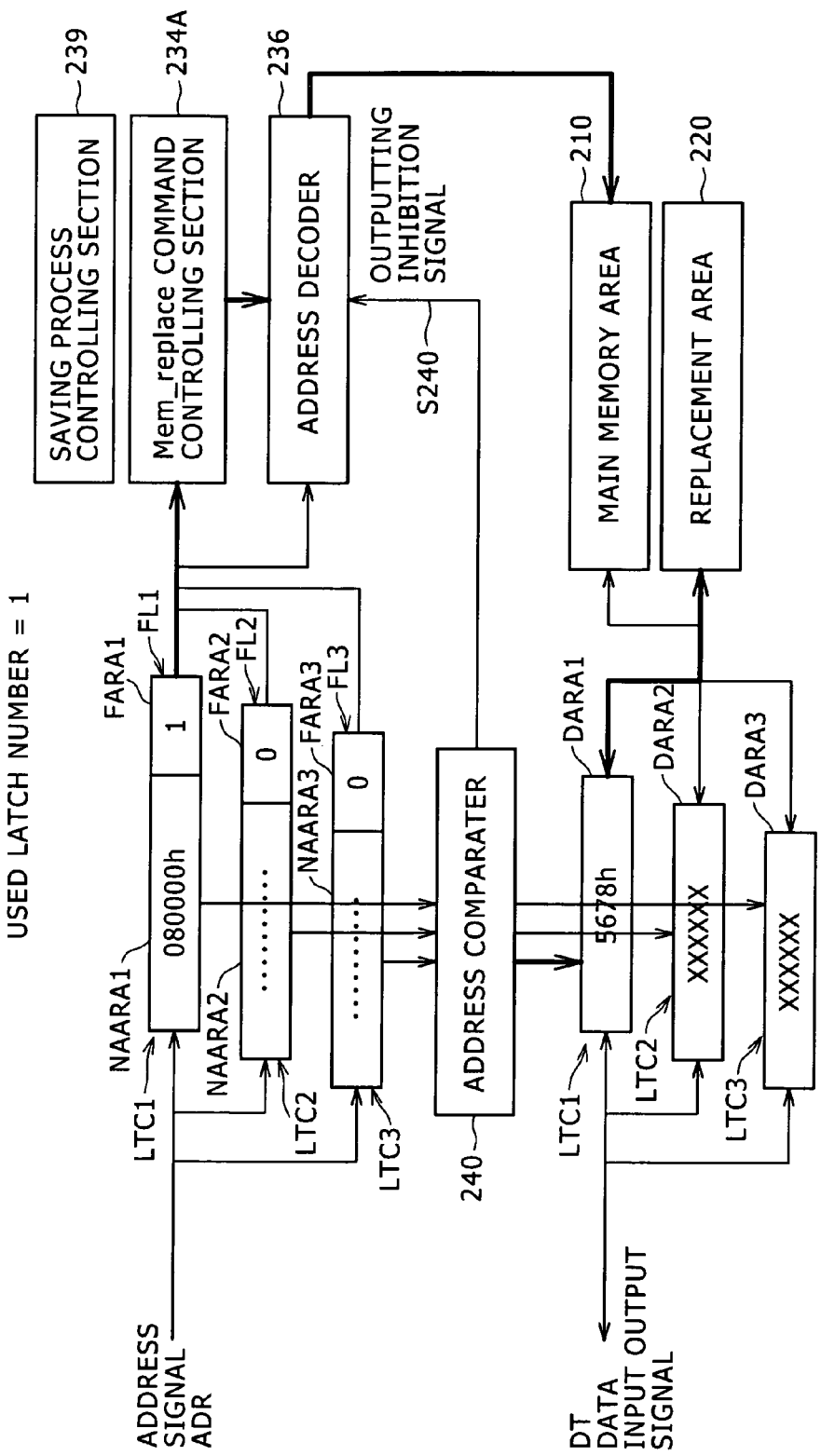
FIG. 20 is a block diagram illustrating a particular example of a replacement process associated with the basic concept of FIG. 15.

FIG. 20 particularly illustrates a replacement process by the configuration of the basic concept of FIG. 15.

In the present example, the address in the address latch region NAARA1 of the save area 238 and the data in the data latch region DARA1 are inputted to and written into the replacement area 220.

The address of a cell in the replacement area 220 to be used as a replacement address is determined based on the value of the address latch region NAARA1 by the Mem_replace command controlling section 234A.

While, in the example of FIG. 15, the save area 238 is formed from three saving latches, the capacity required actually for the save area is determined depending upon the rate of occurrence of defects which appear in the memory.

Where recording into the memory 200A is carried out at a certain fixed transfer rate, a save area sufficient to the number of defective cells which are estimated to occur within a period within which transfer at the fixed rate continues is required.

Generally, the probability in which a defective cell appears is on the ppm level since a defective cell does not appear in a volatile memory and, also with regard to a nonvolatile memory, rewriting by a number of times of several tens of thousands to one hundred thousand is assured. Therefore, it is considered that also the save area required remains within a realistic range in scale.

<2. Second Embodiment>

Figure 21:
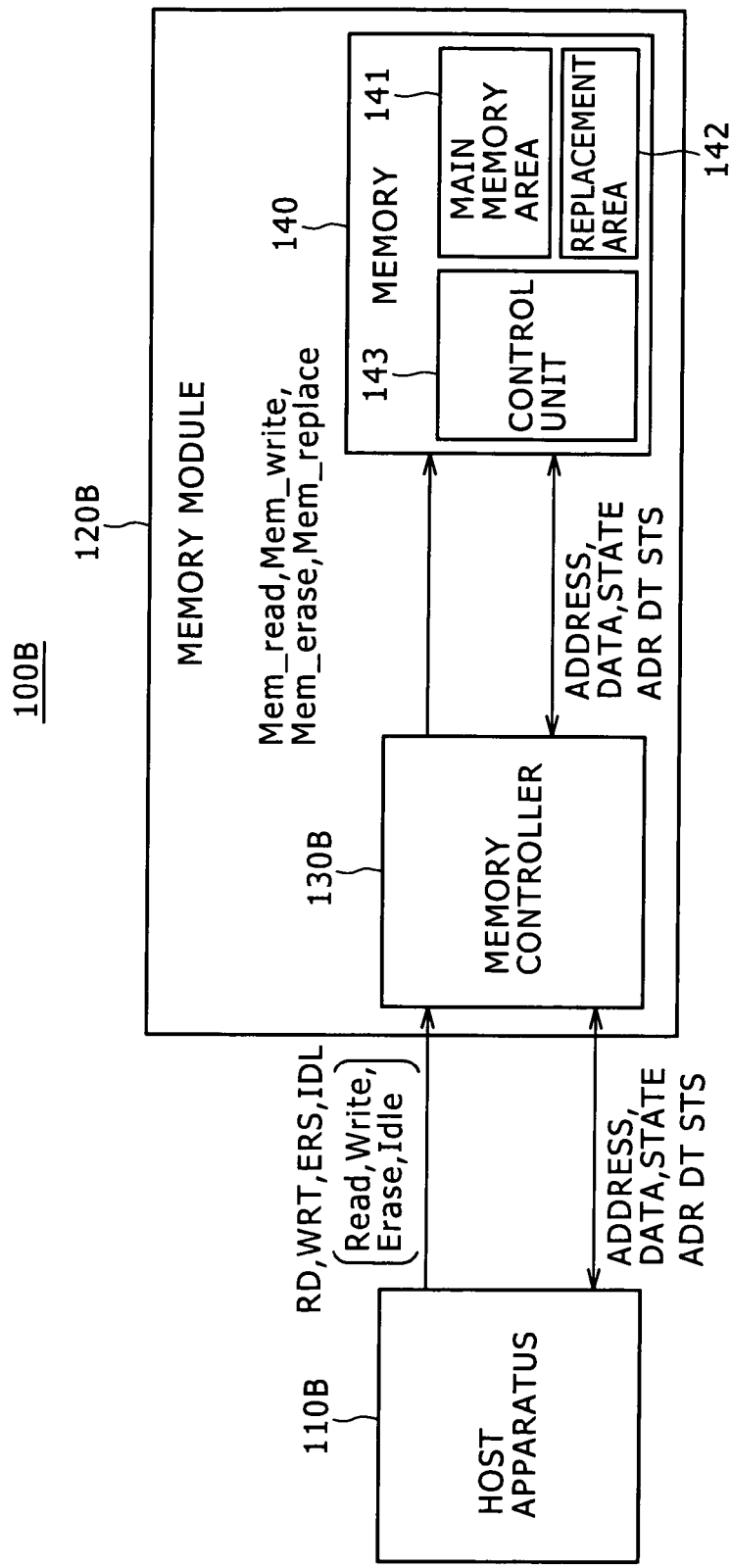
FIG. 21 is a block diagram showing an example of a configuration of a memory system to which a memory apparatus according to a second embodiment of the present invention is applied.

FIG. 21 shows an example of a configuration of a memory system to which a memory apparatus according to a second embodiment of the present invention is applied.

Referring to FIG. 21, a memory system 100B according to the present second embodiment is similar in configuration to the memory system 100 according to the first embodiment except that it is additionally configured so as to be ready also for an erase command, that is, for the Mem_erase command.

A memory controller 130B carries out the following process as a conversion process as an interface between a host apparatus 110B and the memory 140 or 200.

In particular, the memory controller 130B issues instructions for a reading process (Mem_read), a writing process (Mem_write), an erasure process (Mem_erase), a replacement process (Mem_replace) and so forth to the memory 140 to carry out transmission and reception of data DT and reading of status information of the memory 140.

Figure 22:
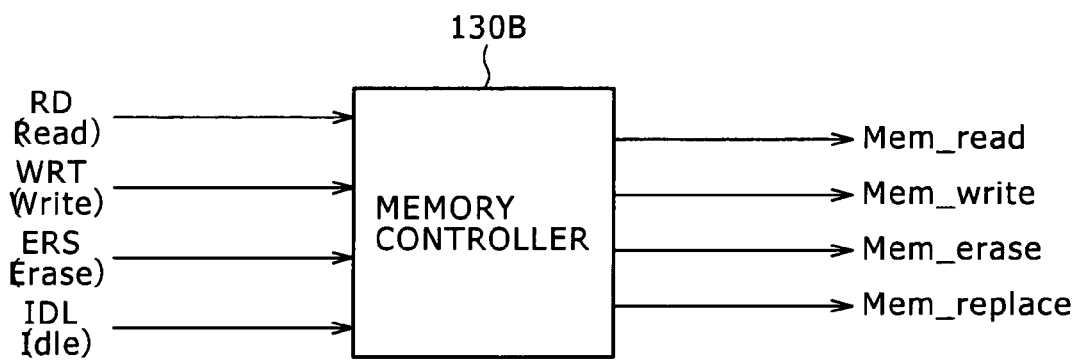
FIG. 22 is a diagrammatic view illustrating an example of correspondence between commands transmitted from a host apparatus to a memory module or memory controller shown in FIG. 21 and commands transmitted from the memory controller to a memory.

FIG. 22 illustrates an example of correspondence between commands to be transmitted from the host apparatus 110B to the memory controller 130B of a memory module 120B and commands to be transmitted from the memory controller 130B to the memory 140.

Referring to FIG. 22, the memory controller 130B converts the read command RD from the host apparatus 110B into a read processing command Mem_read (Mem_read command) and supplies the read processing command Mem_read to the memory 140.

The memory controller 130B converts the write command WRT from the host apparatus 110B into a write processing command Mem_write (Mem_write command) and supplies the write processing command Mem_write to a memory 140B.

Further, the memory controller 130B converts the erase command ERS from the host apparatus 110B into an erase processing command Mem_erase (Mem_erase command) and supplies the erase processing command Mem_erase to the memory 140.

Furthermore, the memory controller 130B converts the idle command IDL from the host apparatus 110B into a replace processing command Mem_replace (Mem_replace command) and supplies the replace processing command Mem_replace to the memory 140.

Figure 23:
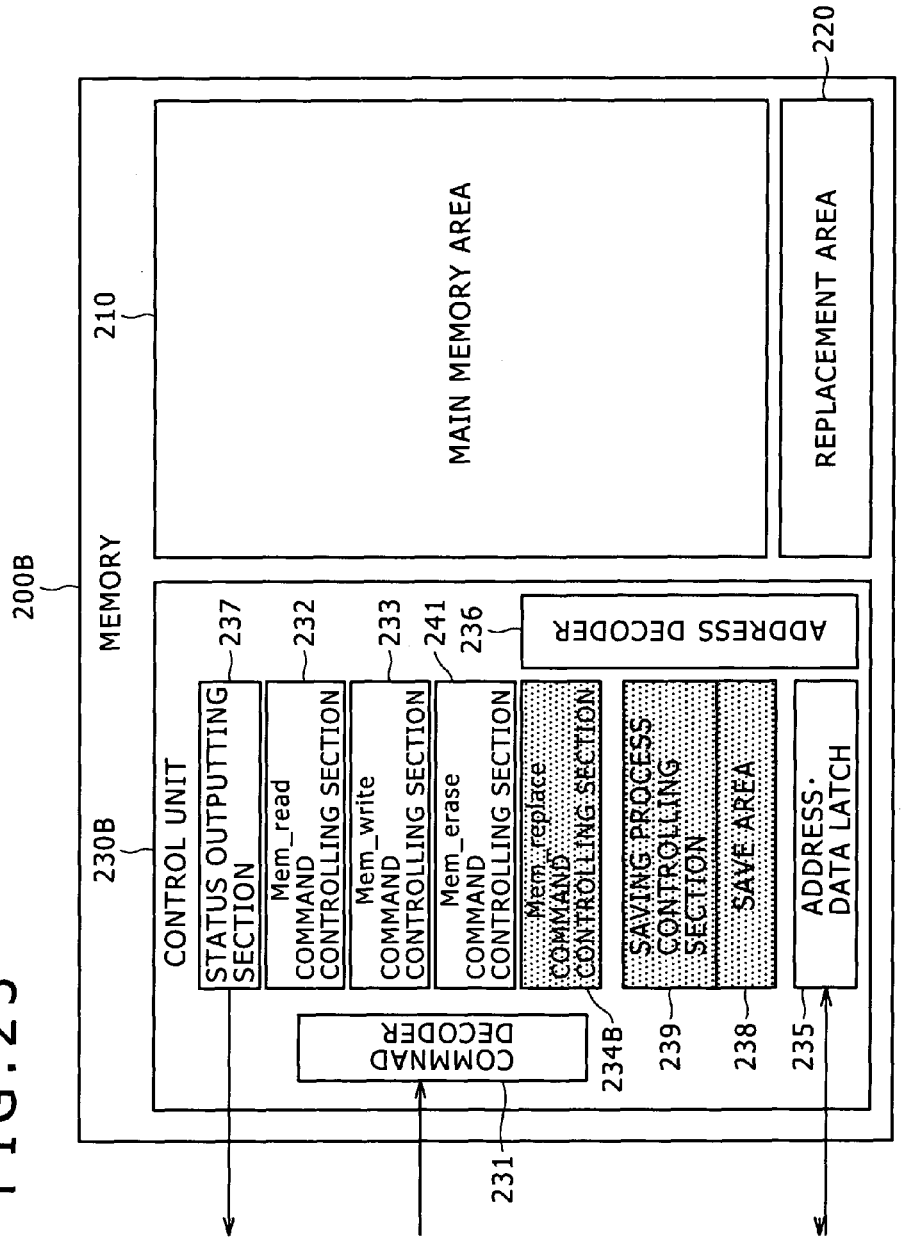
FIG. 23 is a block diagram showing an example of a characteristic configuration of the memory of the memory system of FIG. 21 which is ready for a replacement process.

FIG. 23 shows an example of a characteristic configuration of the memory ready for the replacement process according to the second embodiment.

Referring to FIG. 23, the memory shown in FIG. 21 is denoted by reference characters 200B.

The memory 200B of FIG. 23 includes, in addition to the components of the memory 200A of FIG. 9, a Mem_erase command controlling section 241 for carrying out an erasure process, that is, the Mem_erase process.

The Mem_erase command controlling section 241 carries out, when an erasure error is caused by deterioration of a characteristic of a cell, control for a replacement process similarly as in the case of a writing error.

Figure 24:
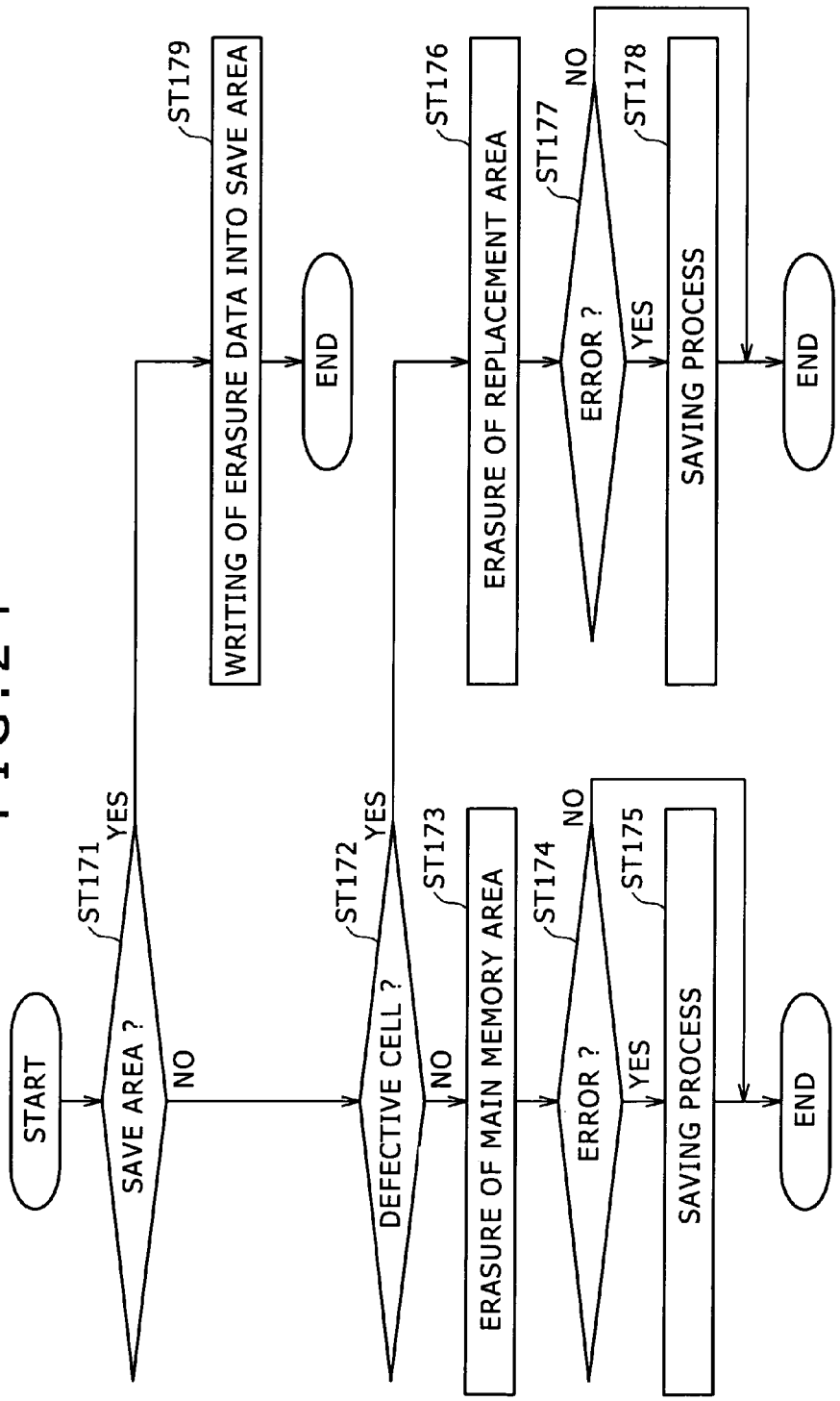
FIG. 24 is a flow chart illustrating a process for a Mem_erase command carried out by a Mem_erase command controlling section of the memory shown in FIG. 23.

FIG. 24 illustrates a processing flow of the Mem_erase command carried out by the Mem_erase command controlling section of the memory of FIG. 23.

The processing flow of FIG. 24 is characterized in that it includes a step of confirming whether or not an accessed cell is allocated to the save area similarly as in the writing of FIG. 10 and a saving process is carried out in place of a replacement process.

In particular, referring to FIG. 24, the Mem_erase command controlling section 241 first confirms whether or not an accessed cell is allocated to a latch in the save area 238 by address comparison at step S171.

If the accessed cell is not allocated to a saving latch in the save area 238, then the Mem_erase command controlling section 241 decides whether or not the accessed cell is a defective cell at step ST172.

If the accessed cell is not a defective cell, then the Mem_erase command controlling section 241 carries out erasure of the memory cell of the main memory area 210 at step ST173.

Then, the Mem_erase command controlling section 241 decides whether or not an error has occurred at step ST174. If an error has occurred, then a notification of this is sent to the saving process controlling section 239 and a saving process is carried out under the control of the saving process controlling section 239 at step ST175.

If it is decided at step ST172 that the accessed cell is a defective cell, then the Mem_erase command controlling section 241 carries out erasure of the memory cell of the replacement area 220 at step ST176.

Then, the Mem_erase command controlling section 241 decides whether or not an error has occurred at step ST177. If an error has occurred, then a notification of this is sent to the saving process controlling section 239 and a saving process is carried out under the control of the saving process controlling section 239 at step ST178.

On the other hand, if it is decided at step ST171 that the accessed cell is allocated to a saving latch of the save area 238, then the saving process controlling section 239 carries out writing of erasure data into the saving latch of the save area 238 at step ST179.

Figure 25:
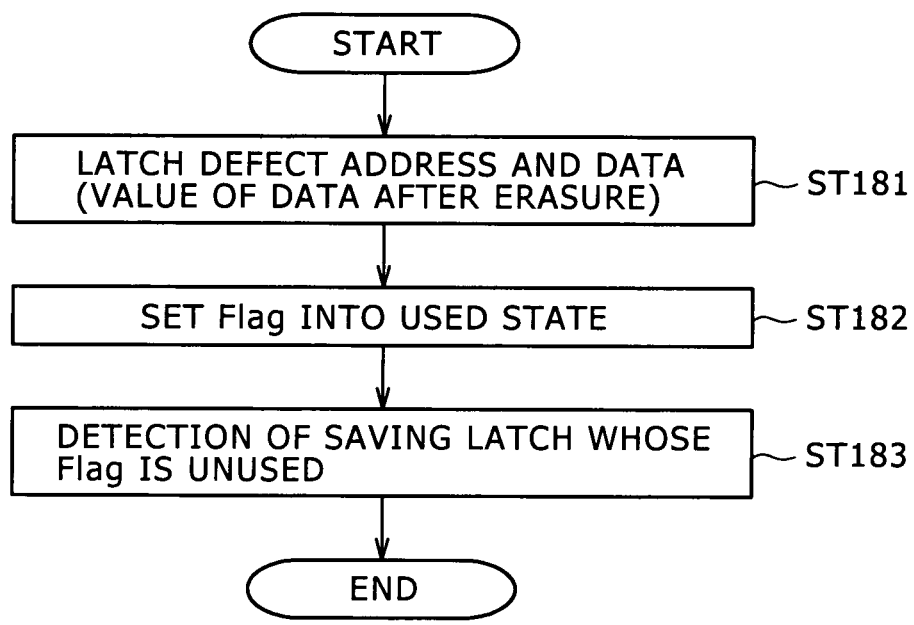
FIG. 25 is a flow chart illustrating a saving process ready for an erasure error carried out by a saving process controlling section shown in FIG. 23.

FIG. 25 illustrates a flow of operations of a saving process ready for an erasure error carried out by the saving process controlling section in the present second embodiment.

It is to be noted that the save area 238 also in this instance includes a plurality of saving latches LTC0 to LTCn basically as seen in FIG. 13, and the saving latches LTC0 to LTCn have a configuration similar to that in FIG. 13. Accordingly, overlapping description of the save area 238 is omitted herein to avoid redundancy.

The saving process prepares in advance a saving latch LTC in an unused state which is to be used subsequently in the save area 238.

If an error which requires a saving process occurs, then the flag FL indicative of a use state of the saving latch LTC is set to "used," in the present example, to "1," and the address of the defective cell and the data which should have been stored into the address are stored into the saving latch at steps ST181 to ST183.

Since the cell after execution of the Mem_erase command exhibits a fixed value representative of an erasure state, the fixed value is retained as data of the saving latch.

The flag FL of the saving latch LTC is re-set to the unused state, in the present example, to "0," for re-use after the later replacement process is completed.

Now, the replacement process according to the second embodiment is described.

Figure 26:
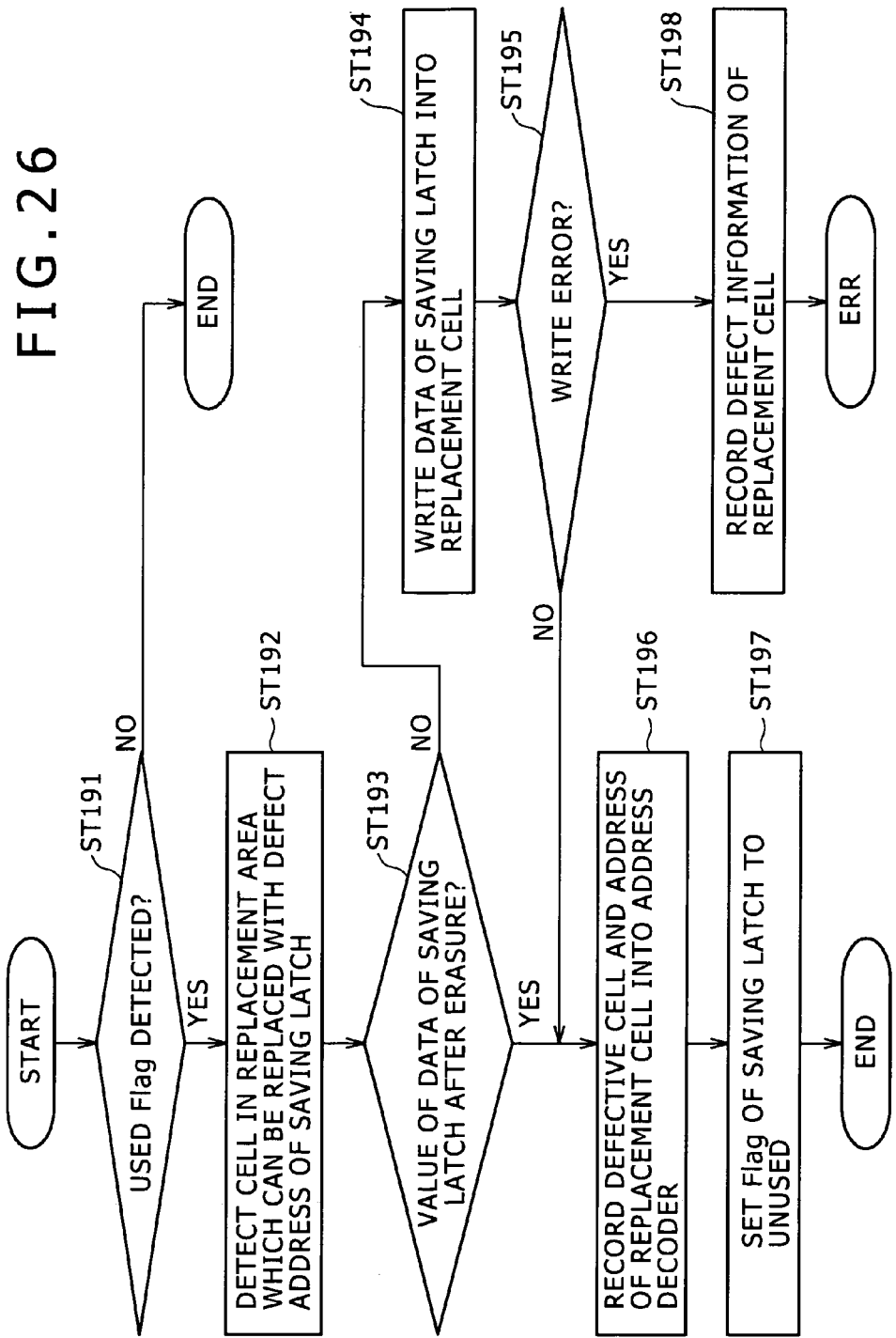
FIG. 26 is a flow chart illustrating a replacement process carried out by the memory system of FIG. 21.

FIG. 26 illustrates a flow of the replacement process in the present second embodiment.

Since the replacement process of FIG. 26 corresponds to the Mem_write and the Mem_erase, and since an unused cell in the replacement area already is in an erased state, a replacement process corresponding to a defective cell with which an erasure error has occurred is not in a written state.

Referring to FIG. 26, first at step ST191, a Mem_replace command controlling section 234B carries out detection of whether or not a saving latch LTC in a used state exists, for example, through the saving process controlling section 239.

In this instance, if a saving latch in a used state does not exist, then the Mem_replace command controlling section 234B immediately ends the replacement process.

On the other hand, if a saving latch LTC in a used state exists, then the Mem_replace command controlling section 234B determines an address of a cell of the replacement area 220 which can be used as a replacement cell from the defect address NADR latched in the saving latch LTC to detects a replacement cell of the replacement area 220 at step ST192.

Then, the Mem_replace command controlling section 234B decides whether or not the latch data of the saving latch LTC exhibits the value after erasure at step ST193.

If the latch data of the saving latch LTC does not have the value after erasure, the Mem_replace command controlling section 234B writes the data DT on the saving latch LTC into the replacement cell at step ST194.

Then, it is decided at step ST195 whether or not a write error has occurred.

If a write error has not occurred and the writing into the replacement cell results in success, or if the latch data of the saving latch LTC has the value after erasure, then the Mem_replace command controlling section 234B records the addresses of the defective cell and the replacement cell into the address decoder 236 at step ST196. Then, accessing to the replacement cell is set so as to be effective upon address decoding.

Finally, the flag FL of the saving latch LTC is cleared to the unused state, that is, set to "0," at step ST197, whereafter the processing is ended.

It is to be noted that, if a writing error has occurred at step ST195, then defect information of the replacement cell is recorded at step ST198.

As a characteristic of the present embodiment, also the replacement process is started in response to an instruction from the host apparatus 110B and the memory controller 130B.

<3. Third Embodiment>

Figure 27:
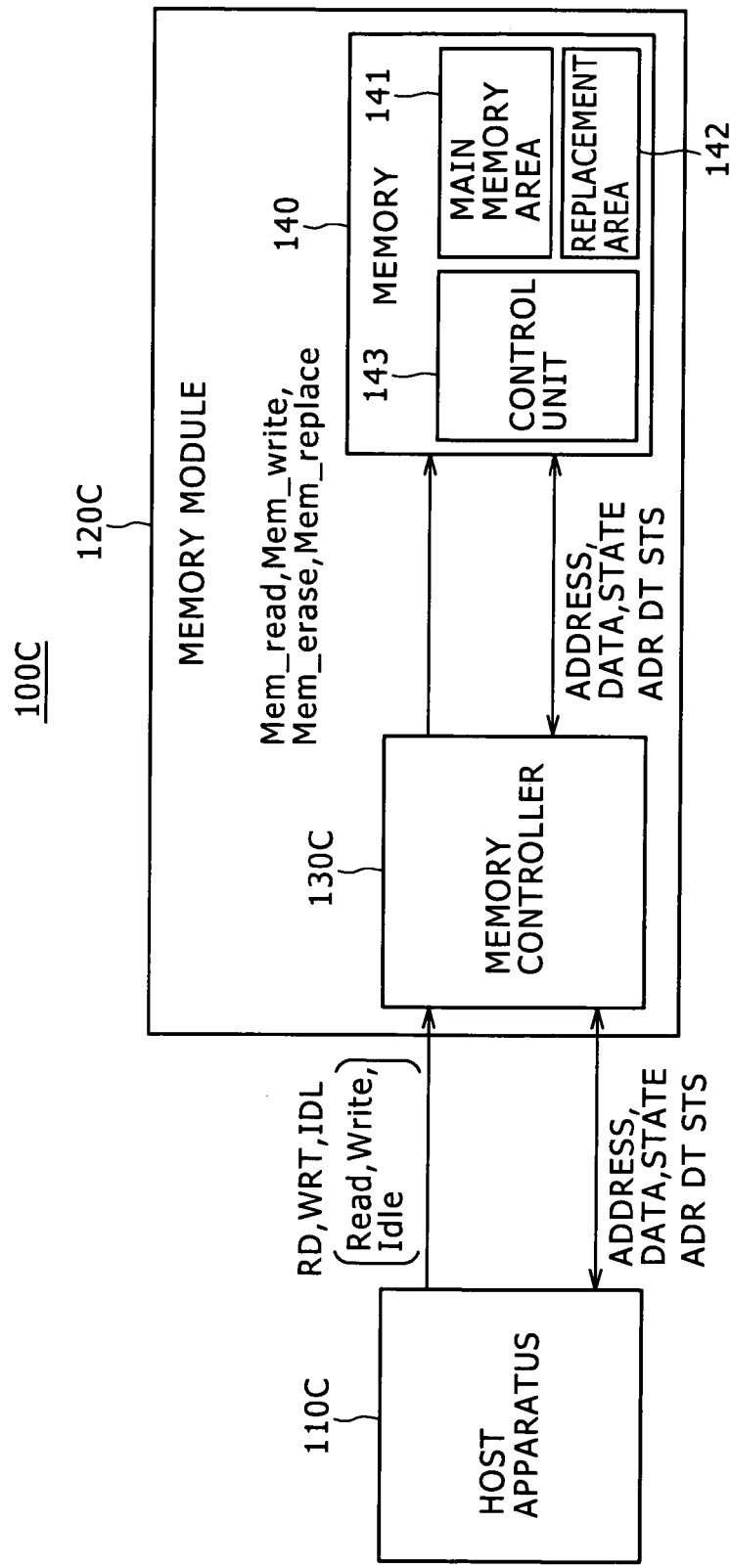
FIG. 27 is a block diagram showing an example of a configuration of a memory system to which a memory apparatus according to a third embodiment of the present invention is applied.

FIG. 27 shows an example of a configuration of a memory system to which a memory apparatus according to a third embodiment of the present invention is applied.

Referring to FIG. 27, a memory system 100C according to the present third embodiment is similar to the memory system 100B according to the second embodiment except that it has a configuration ready for a case wherein a memory module 120C does not have the erase command as a host command.

A memory controller 130C may not have a process for the memory 140 which need not be controlled directly by a host apparatus 110C.

For example, even if the memory module 120C incorporates a memory which requires erasure before writing, it appears, to the host apparatus 110C, as a memory which does not require erasure if it does not have the erase command but has only the write command as a host command.

This role is played by the memory controller 130C.

Figure 28:
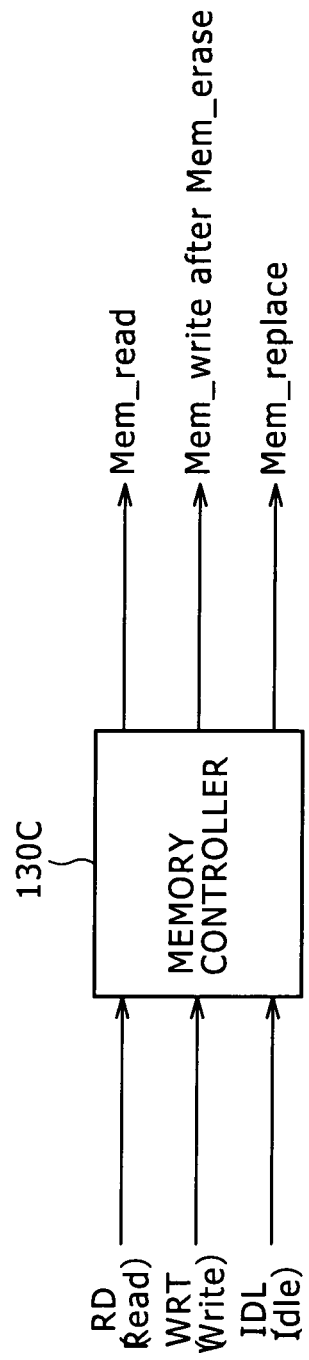
FIG. 28 is a diagrammatic view illustrating an example of correspondence between commands transmitted from a host apparatus to a memory module or memory controller shown in FIG. 27 and commands transmitted from the memory controller to a memory.

FIG. 28 illustrates an example of correspondence between commands to be transmitted from the host apparatus 110C to the memory controller 130C of the memory module 120C and commands to be transmitted from the memory controller 130C to the memory 140.

Referring to FIG. 28, the memory controller 130C converts the read command RD from the host apparatus 110C into a read processing command Mem_read (Mem_read command) and supplies the read processing command Mem_read to the memory 140.

The memory controller 130C converts the write command WRT from the host apparatus 110C into an erase processing command Mem_erase (Mem_erase command) and a write processing command Mem_write (Mem_write command) and supplies the erase processing command Mem_erase and the write processing command Mem_write to the memory 140.

Further, the memory controller 130C converts the idle command IDL from the host apparatus 110C into a replace processing command Mem_replace (Mem_replace command) and supplies the replace processing command Mem_replace to the memory 140.

In this manner, in the memory system 100C according to the present, third embodiment, the memory controller 130 issues the Mem_erase command and the Mem_write command in response to the write command WRT from the host apparatus 110C so that the commands are executed.

While, in the present embodiment, a countermeasure for keeping the writing speed at a speed higher than a certain fixed speed by a saving process is prepared, where a manner of use in which there is no restriction to the writing speed is adopted, it is preferable to have a function capable of setting such a condition that a replacement process is carried out upon occurrence of a writing error as in an ordinary case.

Also where the memory 140 starts a replacement process only in accordance with the Mem_replace command, equivalent operation as viewed from the host apparatus can be implemented if the memory controller 130C transmits the Mem_replace command immediately after a writing error is detected.

As described hereinabove, according to the present embodiment, the following advantages can be achieved.

The memory system according to the embodiment of the present invention can continue, also when a writing error or an erasure error occurs on the memory, the write command at a writing speed higher than a certain fixed speed from the host apparatus to the memory module without having an influence on the performance of a replacement process.

Not only design of a system is facilitated, but also there is no necessity to take a margin in preparation for a replacement process, and as a result, also the performance is improved.

This eliminates the necessity for a buffer, whose provision in the host apparatus is traditionally required, in a memory system, and a cost reduction effect can be achieved by this.

Since the memory system according to the present embodiment has a function of issuing an instruction for a replacement process after writing of data comes to an end, it has flexibility of selecting an optimum timing at which the controller starts the replacement process.

Since the memory system according to the present embodiment has a function of latching the address of a defective cell and data to be written, the host apparatus need not retain and manage information other than information that a defective cell has occurred. Consequently, the load to the host apparatus side and the controller side necessary for the replacement process can be reduced.

While preferred embodiments of the present invention have been described using specific terms, such description is for illustrative purpose only, and it is to be understood that changes and variations may be made without departing from the spirit or scope of the following claims.

Further, the method described hereinabove in detail can be formed as a program which defines the procedure described hereinabove such that the program is executed by a computer including a CPU and so forth.

Further, such a program as just described may be recorded in or on a recording medium such as a semiconductor memory, a magnetic disk, an optical disk or a floppy (registered trademark) disk such that it is accessed by a computer in which the recording medium is loaded so that it is executed by the computer.

The present application contains subject matter related to that disclosed in Japanese Priority Patent Application JP 2009-160458 filed in the Japan Patent Office on Jul. 7, 2009, the entire content of which is hereby incorporated by reference.

What is claimed is:

1. A memory apparatus, comprising:
   a memory having a main memory area and a replacement area; and
   a memory controller having a function of issuing instructions corresponding to commands to carry out transmission and reception of data and reading of status information of said memory;
   said memory including
      a function of issuing, when busy time required for writing does not come to an end within a fixed period of time, an error notification that the memory cell is defective to said memory controller,
      a replacement processing function of changing over a memory cell in said main memory area with which an error has occurred with a memory cell in said replacement area and of storing an address of a defective memory cell and automatically changing over accessing to the defective memory cell upon address decoding to accessing to the replacement memory cell, and
      a save area having a plurality of regions each for saving an address of a defective memory cell and data in pair;
   said save area including, in each of the regions in each of which an address of a defective memory cell and data are saved in pair, a flag indicative of whether the region is in a used state or in an unused state;
   said memory further including
      a function of retaining, when a defective memory cell newly appears, an address of the new defective memory cell and data into one of unused regions of the save area and setting the flag to the used state, and
      a function of setting, when the replacement process is carried out and the information in the save area becomes unnecessary, the flag to the unused state,
   wherein said memory controller discriminates, from among errors included in status information outputted from said memory, any error which requires a replacement process and instructs said memory to carry out a replacement process of the defective memory cell.

2. The memory apparatus according to claim 1, wherein said memory selects an address of a defective memory cell which should be an object of the replacement process from values retained in said plurality of regions of said save area and sets the flag of the one of the plurality of regions having the selected address in accordance with an instruction from said memory controller to the unused state so that the one of the plurality of regions can be re-used when a next error occurs.

3. A memory apparatus, comprising:
   a memory having a main memory area and a replacement area; and
   a memory controller having a function of issuing instructions corresponding to commands to carry out transmission and reception of data and reading of status information of said memory;
   said memory including
      a function of issuing, when busy time required for writing does not come to an end within a fixed period of time, an error notification that the memory cell is defective to said memory controller,
      a replacement processing function of changing over a memory cell in said main memory area with which an error has occurred with a memory cell in said replacement area and of storing an address of a defective memory cell and automatically changing over accessing to the defective memory cell upon address decoding to accessing to the replacement memory cell, and
      a save area having a plurality of regions each for saving an address of a defective memory cell and data in pair;
   said save area including, in each of the regions in each of which an address of a defective memory cell and data are saved in pair, a flag indicative of whether the region is in a used state or in an unused state;

said memory further including
　a function of retaining, when a defective memory cell newly appears, an address of the new defective memory cell and data into one of unused regions of the save area and setting the flag to the used state, and
　a function of setting, when the replacement process is carried out and the information in the save area becomes unnecessary, the flag to the unused state,
wherein said memory retains addresses and data of all defective memory cells appearing before the replacement process is executed, and
wherein said save area has a capacity sufficient to be ready for writing errors which may possibly occur within a period of time until the replacement process becomes possible without disturbing writing in order to implement a writing speed higher than a fixed speed expected for a memory system.

4. A memory apparatus, comprising:
a memory having a main memory area and a replacement area; and
a memory controller having a function of issuing instructions corresponding to commands to carry out transmission and reception of data and reading of status information of said memory;
said memory including
　a function of issuing, when busy time required for writing does not come to an end within a fixed period of time, an error notification that the memory cell is defective to said memory controller,
　a replacement processing function of changing over a memory cell in said main memory area with which an error has occurred with a memory cell in said replacement area and of storing an address of a defective memory cell and automatically changing over accessing to the defective memory cell upon address decoding to accessing to the replacement memory cell, and
　a save area having a plurality of regions each for saving an address of a defective memory cell and data in pair;
said save area including, in each of the regions in each of which an address of a defective memory cell and data are saved in pair, a flag indicative of whether the region is in a used state or in an unused state;
said memory further including
　a function of retaining, when a defective memory cell newly appears, an address of the new defective memory cell and data into one of unused regions of the save area and setting the flag to the used state, and
　a function of setting, when the replacement process is carried out and the information in the save area becomes unnecessary, the flag to the unused state,
wherein said memory can select, where said memory is used from an application which allows an indefinite writing speed, a setting condition that the replacement process is started immediately when an error occurs, and
said memory controller has a function of setting, where said memory controller is used from the application which allows an indefinite writing speed, a condition to start the replacement process immediately when an error occurs.

5. A memory apparatus, comprising:
a memory having a main memory area and a replacement area; and
a memory controller having a function of issuing instructions corresponding to commands to carry out transmission and reception of data and reading of status information of said memory;
said memory including
　a function of issuing, when busy time required for writing does not come to an end within a fixed period of time, an error notification that the memory cell is defective to said memory controller,
　a replacement processing function of changing over a memory cell in said main memory area with which an error has occurred with a memory cell in said replacement area and of storing an address of a defective memory cell and automatically changing over accessing to the defective memory cell upon address decoding to accessing to the replacement memory cell, and
　a save area having a plurality of regions each for saving an address of a defective memory cell and data in pair;
said save area including, in each of the regions in each of which an address of a defective memory cell and data are saved in pair, a flag indicative of whether the region is in a used state or in an unused state;
said memory further including
　a function of retaining, when a defective memory cell newly appears, an address of the new defective memory cell and data into one of unused regions of the save area and setting the flag to the used state, and
　a function of setting, when the replacement process is carried out and the information in the save area becomes unnecessary, the flag to the unused state,
wherein a memory module is formed from said memory and said memory controller, and where execution of an erase command is included for rewriting of data, a host apparatus continues to execute a write command and the erase command at a writing speed higher than a fixed speed into said memory module.

6. A memory apparatus, comprising:
a memory having a main memory area and a replacement area; and
a memory controller configured to issue instructions corresponding to commands to carry out transmission and reception of data and reading of status information of the memory;
the memory including instructions executable to perform operations comprising:
　detecting defective memory cells and issuing an error notification to the memory controller when a defective memory cell is detected,
　replacement processing, which comprises replacing the defective memory cell in the main memory area with a replacement memory cell in the replacement area and of storing an address of the defective memory cell and, upon address decoding, automatically changing over accessing to the defective memory cell to accessing to the replacement memory cell, wherein the memory includes a save area having a plurality of regions, where each of the plurality of regions is for saving an address of a defective memory cell and data corresponding thereto as a pair and includes a flag indicative of whether the corresponding one of the plurality of regions is in a used state or in an unused state,
　saving, when the defective memory cell is newly detected, an address of the defective memory cell and data corresponding thereto as a pair into an unused one of the plurality of regions and setting the flag thereof to the used state, and
　setting the flag of the one of the plurality of regions storing the address of the defective memory cell to the unused state when the replacement processing function is carried out for the defective memory cell.

7. The memory apparatus according to claim 6, wherein, when a writing processing is executed in accordance with a write command, if an address for the writing coincides with an address saved in one of the plurality of regions for which the flag is set to a used state, then the memory rewrites the data retained in the corresponding one of the plurality of regions with data of the write command.

8. The memory apparatus according to claim 6, wherein, when a reading processing is executed in accordance with a reading command, if an address for the reading coincides with an address saved in one of the plurality of regions for which the flag is set to a used state, then the memory outputs the data retained in the corresponding one of the plurality of regions.

9. The memory apparatus according to claim 6, wherein a memory module is formed from said memory and said memory controller and the memory controller is configured to set, when said memory controller is used by an application which requires maintaining a writing speed higher than a fixed speed into the memory module, a condition that the memory not start the replacement processing operation during execution of write commands.

10. The memory apparatus according to claim 9, wherein, when the condition that the memory not start the replacement processing operation during execution of write commands is set, said memory controller discriminates, from among errors included in status information outputted from said memory, any error which requires the replacement processing function and, after completion of a write command and upon receiving an idle command, instructs said memory to carry out the replacement processing function for any defective memory cells detected during execution of the write command.

11. The memory apparatus according to claim 10, wherein, when the condition that the memory not start the replacement processing operation during execution of write commands is set and when the memory is instructed to carry out the replacement processing operation for a defective memory cell, the replacement processing operation further comprises:
selecting an address of the defective memory cell which should be an object of the replacement process from values retained in the plurality of regions for which the flag is set to the used state,
writing the data saved in the one of the plurality of regions that has the selected address into the replacement cell selected to replace the defective memory cell, and
setting the flag of the one of the plurality of regions that has the selected address to the unused state.

12. The memory apparatus according to claim 10, wherein, when the condition that the memory not start the replacement processing operation during execution of write commands is set, the save area retains addresses and data of all defective memory cells appearing before the replacement processing operation is executed.

13. The memory apparatus according to claim 12, wherein said save area has a capacity sufficient to be ready for writing errors which may possibly occur within a period of time until the replacement processing operation becomes possible without disturbing writing in order to implement a writing speed higher than a fixed speed expected for a memory system.

14. The memory apparatus according to claim 9, wherein the memory controller is configured to set, when said memory controller is used by an application which allows an indefinite writing speed into the memory module, a condition that the memory start the replacement processing operation immediately when a defective memory cell is detected.

15. The memory apparatus according to claim 6, wherein when a busy time required for writing to a given memory cell does not come to an end within a certain fixed period of time, the given memory cell is determined to be defective.

16. The memory apparatus according to claim 6, wherein when a busy time required for erasing a given memory cell does not come to an end within a certain fixed period of time, the given memory cell is determined to be defective.

17. A method of controlling a memory comprising:
detecting defective memory cells and issuing an error notification when a defective memory cell is detected,
performing a replacement process comprising replacing the defective memory cell in a main memory area with a replacement memory cell in a replacement area and storing an address of the defective memory cell and, upon address decoding, automatically changing over accessing to the defective memory cell to accessing to the replacement memory cell,
saving, when the defective memory cell is newly detected, an address of the defective memory cell and data as a pair in one of a plurality of regions of a save area and setting a flag of the one of a plurality of regions to a used state, and
setting the flag of the one of a plurality of regions storing the address of the defective memory cell to the unused state when the replacement processing function is carried out for the defective memory cell.

18. A non-transitory computer readable medium having program code stored thereon, the program code being executable by a computer to perform a memory controlling process for controlling a memory including the steps of:
detecting defective memory cells and issuing an error notification when a defective memory cell is detected,
performing a replacement process comprising replacing the defective memory cell in a main memory area with a replacement memory cell in a replacement area and storing an address of the defective memory cell and, upon address decoding, automatically changing over accessing to the defective memory cell to accessing to the replacement memory cell,
saving, when the defective memory cell is newly detected, an address of the defective memory cell and data as a pair in one of a plurality of regions of a save area and setting a flag of the one of a plurality of regions to a used state, and
setting the flag of the one of a plurality of regions storing the address of the defective memory cell to the unused state when the replacement processing function is carried out for the defective memory cell.

* * * * *